US009196663B2

(12) United States Patent
Yamazaki et al.

(10) Patent No.: US 9,196,663 B2
(45) Date of Patent: *Nov. 24, 2015

(54) DISPLAY DEVICE

(71) Applicant: Semiconductor Energy Laboratory Co., Ltd., Atsugi (JP)

(72) Inventors: Shunpei Yamazaki, Tokyo (JP); Jun Koyama, Kanagawa (JP); Mitsuaki Osame, Kanagawa (JP); Mai Osada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/155,432

(22) Filed: Jan. 15, 2014

(65) Prior Publication Data

US 2014/0124773 A1    May 8, 2014

Related U.S. Application Data

(63) Continuation of application No. 13/792,302, filed on Mar. 11, 2013, now Pat. No. 8,638,278, which is a continuation of application No. 13/480,545, filed on May 25, 2012, now Pat. No. 8,400,379, which is a (Continued)

(30) Foreign Application Priority Data

Apr. 18, 2000  (JP) .................. 2000-117045
Mar. 5, 2001  (JP) .................. 2001-059511

(51) Int. Cl.
*H01L 27/32*  (2006.01)
*G09G 3/32*  (2006.01)
*G09G 3/20*  (2006.01)

(52) U.S. Cl.
CPC .......... *H01L 27/3244* (2013.01); *G09G 3/3258* (2013.01); *G09G 3/3266* (2013.01);
(Continued)

(58) Field of Classification Search
CPC ................. G09G 2300/0842; G09G 2320/043
USPC .................................. 345/76–84; 315/169.3
See application file for complete search history.

(56) References Cited

U.S. PATENT DOCUMENTS 4,308,556 A    12/1981  Osaka
4,839,563 A     6/1989  Boudreau et al.
(Continued)

FOREIGN PATENT DOCUMENTS

EP    0372364 A1    6/1990
EP    0391655 A2   10/1990
(Continued)

OTHER PUBLICATIONS

Office action (Application No. 200510003809.0) mailed Feb. 6, 2009 with English translation.
M. Mizukami et al., "6-Bit Digital VGA OLED," SID '00 Digest, vol. XXXI, May 16-18, 2000, pp. 912-915.
Office Action (U.S. Appl. No. 09/833,673), dated Dec. 1, 2004, 10 pages.
(Continued)

*Primary Examiner* — Ricardo L Osorio
(74) *Attorney, Agent, or Firm* — Fish & Richardson P.C.

(57) ABSTRACT

The present invention is intended to suppress power consumption of an EL display. In accordance with the brightness of an image to be displayed in a pixel portion, the contrast of the image is determined whether to be inverted or not, and the number of bits of the digital video signal to be input into the pixel portion is reduced, and the magnitude of a current to flow through the EL element is allowed to be maintained at a constant level even when a temperature of an EL layer changes by providing the EL display with another EL element to be used for monitoring a temperature.

50 Claims, 29 Drawing Sheets

Related U.S. Application Data continuation of application No. 13/030,191, filed on Feb. 18, 2011, now Pat. No. 8,194,008, which is a continuation of application No. 12/609,820, filed on Oct. 30, 2009, now Pat. No. 7,990,348, which is a continuation of application No. 10/920,279, filed on Aug. 18, 2004, now Pat. No. 7,623,098, which is a continuation of application No. 09/833,673, filed on Apr. 13, 2001, now Pat. No. 7,221,338.

(52) U.S. Cl.
CPC .............. *G09G3/3291* (2013.01); *H01L 27/32* (2013.01); *G09G 3/2022* (2013.01); *G09G 2300/0842* (2013.01); *G09G 2300/0866* (2013.01); *G09G 2310/027* (2013.01); *G09G 2310/0251* (2013.01); *G09G 2310/0262* (2013.01); *G09G 2310/0281* (2013.01); *G09G 2320/029* (2013.01); *G09G 2320/041* (2013.01); *G09G 2320/043* (2013.01); *G09G 2330/021* (2013.01); *G09G 2330/028* (2013.01)

(56) References Cited

U.S. PATENT DOCUMENTS

| | | |
|---|---|---|
| 5,041,823 A | 8/1991 | Johnson et al. |
| 5,247,190 A | 9/1993 | Friend et al. |
| 5,399,502 A | 3/1995 | Friend et al. |
| 5,414,443 A | 5/1995 | Kanatani et al. |
| 5,594,463 A | 1/1997 | Sakamoto |
| 5,597,223 A | 1/1997 | Watanabe et al. |
| 5,701,055 A | 12/1997 | Nagayama et al. |
| 5,745,085 A | 4/1998 | Tomio et al. |
| 5,844,535 A | 12/1998 | Itoh et al. |
| 5,856,816 A | 1/1999 | Youn |
| 5,882,761 A | 3/1999 | Kawami et al. |
| 5,886,474 A | 3/1999 | Asai et al. |
| 5,893,730 A | 4/1999 | Yamazaki et al. |
| 5,990,629 A | 11/1999 | Yamada et al. |
| 6,005,350 A | 12/1999 | Hachiya et al. |
| 6,008,801 A | 12/1999 | Jeong |
| 6,049,321 A | 4/2000 | Sasaki |
| 6,054,976 A | 4/2000 | Kubota et al. |
| 6,069,676 A | 5/2000 | Yuyama |
| 6,072,448 A | 6/2000 | Kojima et al. |
| 6,097,302 A | 8/2000 | Zinzell |
| 6,127,993 A | 10/2000 | Ohba et al. |
| 6,147,451 A | 11/2000 | Shibata et al. |
| 6,219,113 B1 | 4/2001 | Takahara |
| 6,320,325 B1 | 11/2001 | Cok et al. |
| 6,335,713 B1 | 1/2002 | Imai |
| 6,373,459 B1 | 4/2002 | Jeong |
| 6,376,994 B1 | 4/2002 | Ochi et al. |
| 6,380,558 B1 | 4/2002 | Yamazaki et al. |
| 6,392,617 B1 | 5/2002 | Gleason |
| 6,396,468 B2 | 5/2002 | Matsushima et al. |
| 6,396,508 B1 | 5/2002 | Noecker |
| 6,404,137 B1 | 6/2002 | Shodo |
| 6,411,306 B1 | 6/2002 | Miller et al. |
| 6,414,661 B1 | 7/2002 | Shen et al. |
| 6,417,824 B1 | 7/2002 | Tokunaga et al. |
| 6,424,326 B2 | 7/2002 | Yamazaki et al. |
| 6,429,584 B2 | 8/2002 | Kubota |
| 6,452,576 B1 | 9/2002 | Van Velzen et al. |
| 6,469,439 B2 | 10/2002 | Himeshima et al. |
| 6,486,862 B1 | 11/2002 | Jacobsen et al. |
| 6,496,218 B2 | 12/2002 | Takigawa et al. |
| 6,518,941 B1 | 2/2003 | Kimura |
| 6,518,962 B2 | 2/2003 | Kimura et al. |
| 6,525,704 B1 | 2/2003 | Kondo et al. |
| 6,528,951 B2 | 3/2003 | Yamazaki et al. |
| 6,534,925 B2 | 3/2003 | Kawashima |
| 6,552,736 B2 | 4/2003 | Honda et al. |
| 6,559,594 B2 | 5/2003 | Fukunaga et al. |
| 6,693,616 B2 | 2/2004 | Koyama et al. |
| 6,756,820 B1 | 6/2004 | Heyne et al. |
| 6,784,864 B1 | 8/2004 | Koyama et al. |
| 6,816,144 B2 | 11/2004 | Tsuchi |
| 6,873,275 B2 | 3/2005 | Komamura et al. |
| 7,623,098 B2 | 11/2009 | Yamazaki et al. |
| 8,237,355 B2 | 8/2012 | Yamazaki |
| 8,400,379 B2* | 3/2013 | Yamazaki et al. .............. 345/76 |
| 2001/0010374 A1* | 8/2001 | Takayama ...................... 257/98 |
| 2001/0017618 A1 | 8/2001 | Azami |
| 2001/0017683 A1 | 8/2001 | Hiroki et al. |
| 2001/0026257 A1 | 10/2001 | Kimura |
| 2002/0030649 A1 | 3/2002 | Zavracky et al. |
| 2002/0053884 A1 | 5/2002 | Kimura |
| 2002/0105493 A1 | 8/2002 | Komiya |
| 2002/0145602 A1 | 10/2002 | Matsueda |
| 2002/0154151 A1 | 10/2002 | Koyama |
| 2002/0180672 A1 | 12/2002 | Yamazaki et al. |
| 2002/0180721 A1 | 12/2002 | Kimura et al. |
| 2003/0063081 A1 | 4/2003 | Kimura et al. |
| 2003/0132716 A1 | 7/2003 | Yamazaki et al. |
| 2004/0201583 A1 | 10/2004 | Burroughes et al. |
| 2004/0239668 A1 | 12/2004 | Morosawa et al. |
| 2005/0017933 A1 | 1/2005 | Koyama |
| 2005/0017963 A1 | 1/2005 | Yamazaki et al. |
| 2005/0017964 A1 | 1/2005 | Yamazaki et al. |
| 2005/0162371 A1 | 7/2005 | Morita |

FOREIGN PATENT DOCUMENTS

| | | |
|---|---|---|
| EP | 0707301 A1 | 4/1996 |
| EP | 0923067 A1 | 6/1999 |
| JP | 56-119179 A | 9/1981 |
| JP | 61-083593 A | 4/1986 |
| JP | 62-192792 A | 8/1987 |
| JP | 05-094151 A | 4/1993 |
| JP | 07-036410 A | 2/1995 |
| JP | 08-171370 A | 7/1996 |
| JP | 09-148066 A | 6/1997 |
| JP | 10-092576 A | 4/1998 |
| JP | 10-214060 A | 8/1998 |
| JP | 10-232649 A | 9/1998 |
| JP | 10-268842 A | 10/1998 |
| JP | 10-312173 A | 11/1998 |
| JP | 11-054268 A | 2/1999 |
| JP | 11-272223 A | 10/1999 |
| JP | 11-273856 A | 10/1999 |
| JP | 2000-013209 A | 1/2000 |
| JP | 2000-089736 A | 3/2000 |
| JP | 2000-098330 A | 4/2000 |
| JP | 2001-109433 A | 4/2001 |
| JP | 2002-511608 A | 4/2002 |
| TW | 250560 A | 7/1995 |
| WO | WO 90/07768 A1 | 7/1990 |
| WO | WO 90/13148 A1 | 11/1990 |
| WO | WO 98/40871 A1 | 9/1998 |
| WO | WO 99/53472 A1 | 10/1999 |
| WO | WO 01/27910 A1 | 4/2001 |

OTHER PUBLICATIONS

Office Action (U.S. Appl. No. 09/833,673), dated Aug. 19, 2005, 6 pages.
Office Action (U.S. Appl. No. 09/833,673), dated Feb. 24, 2006, 6 pages.
Office action (U.S. Appl. No. 200510003809.0) mailed Feb. 6, 2009 with English translation.
R. Dawson et al., "Design of an Improved Pixel for a Polysilicon Active-Matrix Organic LED Display," SID '98 Digest, vol. XXIX, May 17-22, 1998, pp. 11-14.
M. Mizukami et al., "6-Bit Digital VGA OLED," SID '00 Digest, vol. XXXI, May 16-18, 2000, pp. 912- 915.
Schenk et al., "Polymers for Light Emitting Diodes," EuroDisplay '99: Proceedings of the 19th International Display Research Conference, Sep. 1999, pp. 33-37.
Search Report (European Application No. 01109581.7) dated May 11, 2009.
European Office Action (Application No. 01109581.7), dated Sep. 17, 2015.

\* cited by examiner

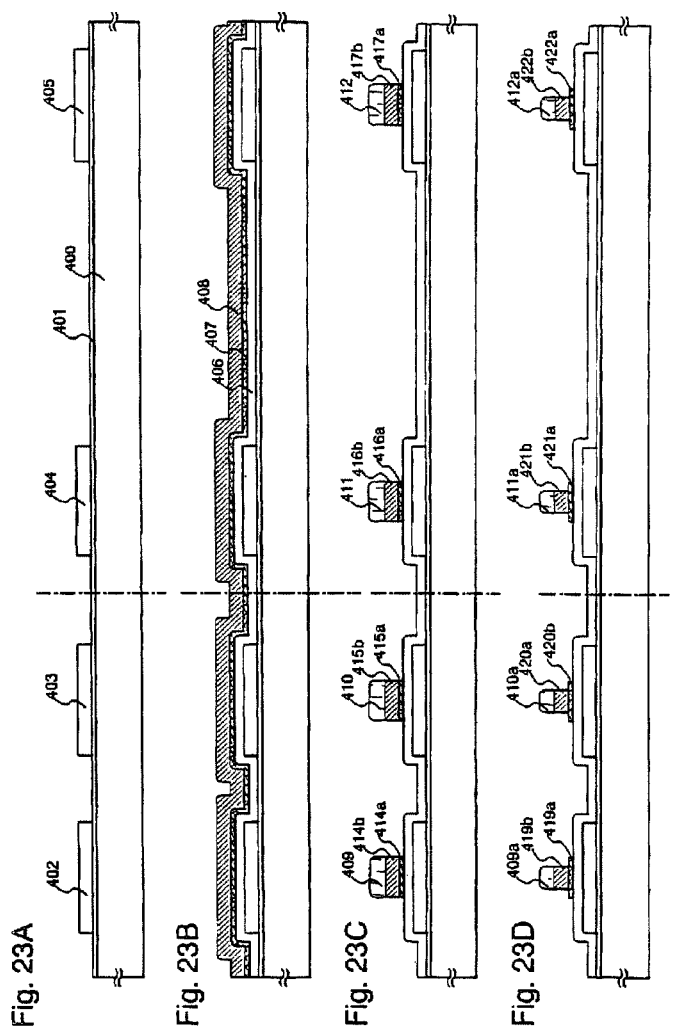

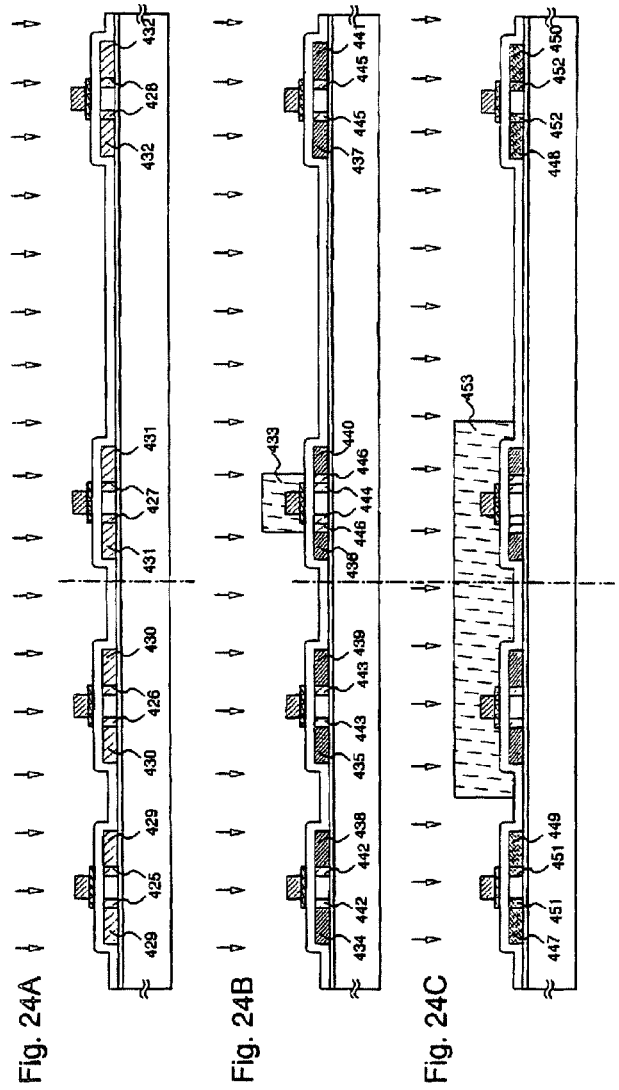

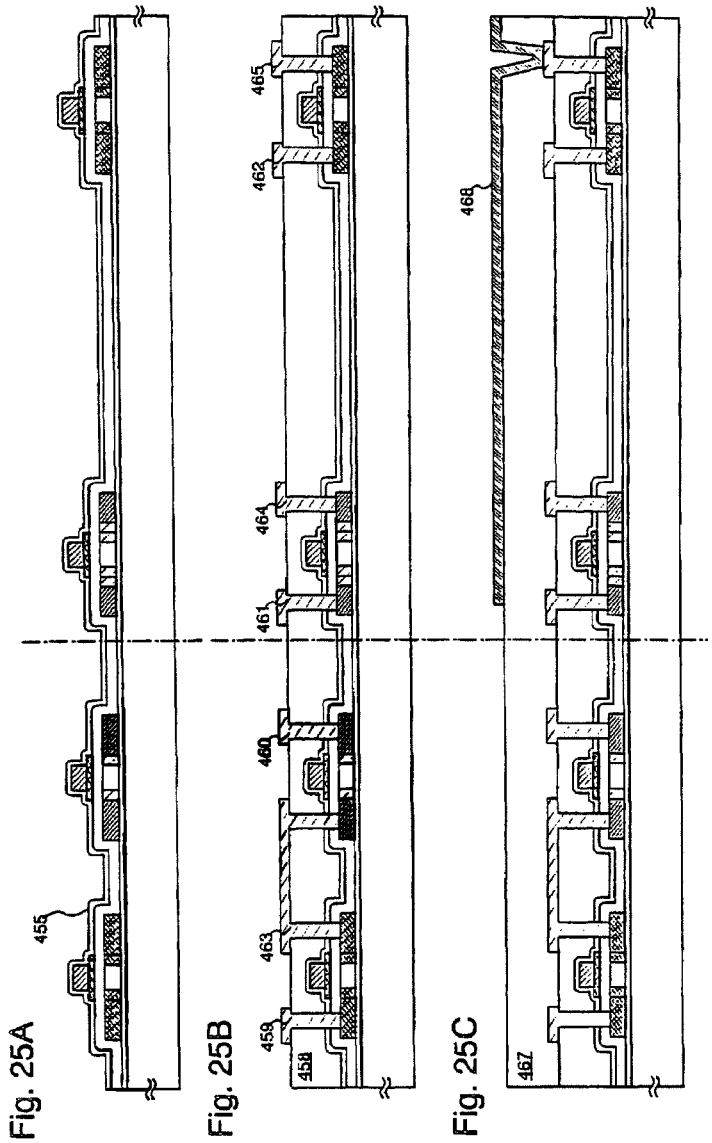

DISPLAY DEVICE

CROSS-REFERENCE TO RELATED APPLICATIONS

This application is a continuation of U.S. application Ser. No. 13/792,302, filed Mar. 11, 2013, now allowed, which is a continuation of U.S. application Ser. No. 13/480,545, filed May 25, 2012, now U.S. Pat. No. 8,400,379, which is a continuation of U.S. application Ser. No. 13/030,191, filed Feb. 18, 2011, now U.S. Pat. No. 8,194,008, which is a continuation of U.S. application Ser. No. 12/609,820, filed Oct. 30, 2009, now U.S. Pat. No. 7,990,348, which is a continuation of U.S. application Ser. No. 10/920,279, filed Aug. 18, 2004, now U.S. Pat. No. 7,623,098, which is a continuation of U.S. application Ser. No. 09/833,673, filed Apr. 13, 2001, now U.S. Pat. No. 7,221,338, which claims the benefit of foreign priority applications filed in Japan as Serial No. 2000-117045 on Apr. 18, 2000, and Serial No. 2001-059511 on Mar. 5, 2001, all of which are incorporated by reference.

BACKGROUND OF THE INVENTION

1. Field of the Invention

The present invention relates to a display panel in which a light emitting element formed on a substrate is sealed between the substrate and a cover member. In addition, the present invention also relates to a display module in which an IC chip is mounted on the above-mentioned display panel. It should be noted that in the present specification, the display panel and the display module are collectively referred to as the light emitting device. The present invention further relates to an electronic apparatus that employs the above-mentioned light emitting device.

2. Description of the Related Art

Recently, techniques for forming a TFT on a substrate has been greatly advanced, and much developments have been made to apply those techniques to an active-matrix type display device. In particular, a TFT employing a poly-crystalline silicon film can operate at a higher speed since a field effect mobility (simply referred to as the mobility) thereof is larger than that of a TFT employing the conventional amorphous silicon film. Thus, it becomes possible to control pixels by means of a driver circuit formed on the same substrate as the pixels. Such the pixels was conventionally controlled by means of a driver circuit provided at the outside of the substrate.

The active-matrix type display device as mentioned above can exhibit various advantages such as a reduced fabricating cost, miniaturization of the display device, an increased fabricating yield, a reduced throughput or the like, by providing various circuits and elements on the identical substrate.

Furthermore, developments of an active-matrix type light emitting device having light emitting elements as a self-emission type element have been actively conducted. Such a light emitting device is also referred to as an Organic EL Display (OELD) or an Organic Light Emitting Diode (OLED).

Unlike a liquid crystal display, the light emitting device is of the self-emission type. The light emitting element has a structure in which a layer containing an organic compound (hereinafter referred to as the organic compound layer) that allows luminescence to be generated by applying an electrical field thereto is interposed between a pair of electrodes (an anode and a cathode). The organic compound layer usually has a layered structure. Typical examples therefor include a layered structure of "a hole transportation layer, a light emitting layer/an electron transportation layer" proposed by Tang et al. of Eastman Kodak Co. This structure has a high luminous efficiency, and most of light emitting devices about which research and development activities are currently being progressed employ this structure.

Although a luminescence in an organic compound includes a singlet excitation (fluorescence) and a triplet excitation (phosphorescence), the light emitting device of the present invention can use one or both of the above luminescence.

Alternatively, a layered structure in which a hole injection layer/a hole transportation layer/a light emitting layer/an electron transportation layer, or a hole injection layer/a hole transportation layer/a light emitting layer/an electron transportation layer/an electron injection layer are formed on an anode in these orders may be used. Furthermore, fluorescent dyes or the like may be doped into the light emitting layer.

In the present specification, all of the layers to be disposed between the cathode and the anode are collectively referred to as the organic compound layer. Accordingly, all of the above-mentioned layers such as the hole injection layer, the hole transportation layer, the light emitting layer, the electron transportation layer, the electron injection layer or the like are included in the organic compound layer.

A predetermined voltage is applied to the organic compound layer made of the above-mentioned structure via the pair of electrodes, and thus recombination of carriers occurs in the light emitting layer, thereby resulting in light emission. In the present specification, when the light emitting element emits light, the light emitting element is expressed as being driven. In addition, in the present specification, the light emitting element composed of an anode, an organic compound layer, and a cathode is referred to as the light emitting element.

Since the light emitting device is not required to employ a back light, a thickness and a weight of the display itself can be suppressed, as compared to a liquid crystal display. For that reason, the light emitting device has come to be used as a display section of a portable information terminal (a mobile computer, a portable telephone, a portable game apparatus, an electronic book or the like), instead of the liquid crystal display.

In order to suppress power consumption of the portable information terminal, it has been desired to suppress power consumption of the light emitting device to be employed as the display section.

Moreover, digitalization of a receiver or a VTR to be used in home as well as various equipment to be used in a TV or radio broadcast station has now proceeded. As the next step following digitalization of a broadcast system is digitalization of broadcast electric waves, i.e., realization of digital broadcasting. Vigorous research and development activities have been performed toward such a goal.

One scheme to be used for realizing a digital driving of the light emitting device is a temporal gradation display. More specifically, the temporal gradation display refers to a driving method in which the gradation display is performed by controlling a time period during which the light emitting element is to emit light in one frame period.

In the case where the light emitting device is digitally driven to perform the temporal gradation display, the required number of rewriting a digital video signal containing image information to be input to pixels is increased, as the number of gradation of an image to be displayed is increased. Consequently, power consumption of a group of driver circuits to be used for inputting the digital video signal into the pixels is increased, thereby resulting in increased power consumption of the light emitting device.

In addition, since the light emitting element is of the self-emission type, a time period during which the light emitting element is to emit light in one frame period varies depending on an image to be displayed. Accordingly, power consumption of the light emitting device in turn varies depending on an image to be displayed.

Furthermore, the magnitude of a current to flow through the light emitting element varies also depending on temperature. Even with a voltage of the same magnitude being applied across the electrodes of the light emitting element, the magnitude of a current to flow through the light emitting element varies due to temperature characteristics of the light emitting element. For example, as the temperature of the organic compound layer increases, a larger current tends to flow. Accordingly, as an environmental temperature under which the light emitting element is to be used increases, power consumption of the light emitting device increases, which in turn increases the brightness of the light emitting element.

In view of the above-described situations, the present invention is intended to suppress power consumption of a light emitting device and an electronic apparatus employing the light emitting device as its display section.

SUMMARY OF THE INVENTION

A first structure according to the present invention is characterized in which in the case where a monochrome display is performed in a light emitting device, the contrast of an image is determined whether to be inverted or not in accordance with what kind of an image to be displayed by pixels in a pixel portion.

In accordance with the above-mentioned structure, the magnitude of a current to flow through the light emitting element can be suppressed to some degree, thereby resulting in a reduced power consumption of the light emitting device.

Furthermore, a second structure in accordance with the present invention is characterized in that in a light emitting device that performs a digitally-driven time-divisional gradation display, a digital video signal input to a source signal line driver circuit included in the light emitting device is input into a pixel portion after its number of bits is reduced. More specifically, a bit of the digital video signal is sequentially cut off from the least significant bit to reduce the number of bits of the digital video signal to be input into the pixel portion.

In accordance with the above-mentioned structure, since the number of bits of the digital video signal to be input into the pixels is reduced, the required number of writing the digital video signal by the source signal line driver circuit and a gate signal line driver circuit can be reduced. Thus, power consumption of the source signal line driver circuit and the gate signal line driver circuit can be reduced, thereby resulting in a reduced power consumption of the light emitting device.

Moreover, in accordance with a third structure of the present invention, a light emitting device is provided with a light emitting element for monitoring a temperature. One of electrodes of the temperature-monitoring light emitting element is connected to a constant current source. Thus, by means of temperature characteristics of the temperature-monitoring light emitting element, the magnitude of a current to flow through a light emitting element of a pixel is maintained at a constant level.

In accordance with the above-described structure, the magnitude of a current to flow through the light emitting element of a pixel is maintained at a constant level, even when a temperature of the organic compound layer changes. Thus, power consumption of the light emitting device can be prevented from increasing even when an environmental temperature of the light emitting device increases, which in turn can maintain the brightness at a constant level.

In accordance with the first, second, and third structures of the present invention as described in the above, it is possible to suppress the power consumption of a light emitting device and an electronic apparatus which employs the light emitting device. It should be noted that only either one of the first through third structures is required to be included in the present invention, although two or all of the first through third structures may be included.

Structures in accordance with the present invention will be further described below.

The present invention provides a display device having a plurality of pixels, wherein a polarity of a digital video signal to be input into the plurality of pixels is inverted, thereby resulting in brightness of the plurality of pixels being changed.

The present invention provides a display device having a pixel portion including a plurality of pixels, and a source signal line driver circuit, wherein the source signal line driver circuit includes a switching circuit for switching a polarity of an output, and a polarity of a digital video signal input to the switching circuit is inverted by means of a shift signal to be input into the switching circuit and the resultant signal is then input into the plurality of pixels.

The present invention provides a display device having a pixel portion including a plurality of pixels, and a source signal line driver circuit, wherein each of the plurality of pixels has a light emitting element, and the source signal line driver circuit includes a shift register, one or more latches and a switching circuit, and a polarity of a digital video signal input from the one or more latches into the switching circuit is inverted by means of a shift signal to be input into the switching circuit and the resultant signal is then input into the plurality of pixels.

The present invention provides a display device having a pixel portion including a plurality of pixels, and a source signal line driver circuit, wherein each of the plurality of pixels has a light emitting element, and the source signal line driver circuit includes a shift register, one or more latches and a switching circuit, and a polarity of a digital video signal input from the one or more latches into the switching circuit is inverted by means of a shift signal to be input into the switching circuit and the resultant signal is then input into the plurality of pixels, and an average of a time period during which all of the light emitting elements emit light in one frame period is equal to or less than a half of the maximum value of the time period during which all of the light emitting elements emit light in one frame period.

The above structures may be characterized in which the switching circuit includes an inverter, a first analog switch, and a second analog switch, wherein the digital video signal input into the switching circuit is input into an input terminal of the first analog switch via the inverter, the digital video signal output from the one or more latches is input into an input terminal of the second analog switch, the shift signal is input from a first control input terminal of the first analog switch and a second control input terminal of the second analog switch, a signal obtained by inverting the polarity of the shift signal is input from a second control input terminal of the first analog switch and a second control input terminal of the first analog switch, and signals output from output terminals of the first analog switch and the second analog switch are output from the switching circuit.

The above structures may be characterized in which the switching circuit includes an inverter, a first NAND, a second NAND, and a NOR, wherein the first NAND is supplied with the digital video signal via the inverter and the shift signal, the second NAND is supplied with the digital video signal and a signal obtained by inverting a polarity of the shift signal, a signal output from the first NAND and a signal output from the second NAND are input into the NOR, and a signal output from the NOR is output from the switching circuit.

The present invention provides a display device having a plurality of pixels and a source signal line driver circuit, wherein among a digital video signal to be input into the source signal line driver circuit, only more significant bits are input into the plurality of pixels.

The present invention provides a display device having a pixel portion including a plurality of pixels, and a source signal line driver circuit, wherein the source signal line driver circuit includes a shift register, a first latch, a second latch, and a clock signal control circuit, a clock signal is input into the shift register via the clock signal control circuit to thereby output a timing signal from the shift register, a digital video signal is input into and held at the first latch by the timing signal, the digital video signal held at the first latch is input into and held at the second latch by a latch signal, the digital video signal input into and held at the second latch is input into the plurality of pixels, and the clock signal control circuit reduces the number of bits of the digital video signal to be input into and held at the first latch by supplying a constant fixed electrical potential instead of the clock signal to the shift register for a constant period of time.

The above structure may be characterized in which the clock signal control circuit includes a NAND and an inverter, wherein a clock signal and a selection signal are input into the NAND, and a signal output from the NAND is output from the clock signal control circuit via the inverter.

The above structure may be characterized in which the clock signal control circuit includes a first analog switch, a second analog switch, and an inverter, wherein a selection signal is input via the inverter into a second control input terminal of the first analog switch and a first control input terminal of the second analog switch, the selection signal is input into a first control input terminal of the first analog switch and a second control input terminal of the second analog switch. A clock signal is input into an input terminal of the first analog switch, a fixed electrical potential is supplied to an input terminal of the second analog switch, and signals output from output terminals of the first analog switch and the second analog switch are output from the clock signal control circuit.

The present invention provides a display device having a pixel portion including a plurality of pixels, and a source signal line driver circuit, wherein the source signal line driver circuit includes a shift register, a first latch, a second latch, and a timing signal control circuit, a timing signal output from the shift register is input into the first latch via the timing signal control circuit, a digital video signal is input into and held at the first latch by the timing signal input into the first latch, the digital video signal held at the first latch is input into and held at the second latch by a latch signal, the digital video signal input into and held at the second latch is input into the plurality of pixels, and the timing signal control circuit reduces the number of bits of the digital video signal to be input into and held at the first latch by supplying to the first latch a constant fixed electrical potential instead of the timing signal output from the shift register for a constant period of time.

The above structure may be characterized in which the timing signal control circuit includes a NAND and an inverter, wherein a timing signal and a selection signal are input into the NAND, and a signal output from the NAND is output from the timing signal control circuit via the inverter.

The above structure may be characterized in which the timing signal control circuit includes a first analog switch, a second analog switch, and an inverter, wherein a selection signal is input via the inverter into a second control input terminal of the first analog switch and a first control input terminal of the second analog switch, the selection signal is input into a first control input terminal of the first analog switch and a second control input terminal of the second analog switch, the timing signal is input into an input terminal of the first analog switch, a fixed electrical potential is supplied to an input terminal of the second magnitude of a current to flow through the plurality of light emitting elements is maintained by means of temperature characteristics of the monitoring light emitting element.

The present invention provides a display device including a pixel portion including a plurality of pixels, a power source line, a buffer amplifier, a monitoring light emitting element, and a constant current source, wherein each of the plurality of pixels includes a thin film transistor and a light emitting element, each of the monitoring light emitting element and the light emitting element includes a first electrode, a second electrode, and an organic compound layer disposed between the first electrode and the second electrode. The first electrode of the monitoring light emitting element is connected to the constant current source, the first electrode of the monitoring light emitting element is also connected to a non-inverted input terminal of the buffer amplifier, and an output terminal of the buffer amplifier is connected to the power source line, and an electrical potential of the power source line is applied to the first electrode of the light emitting element via the thin film transistor.

The present invention provides a display device including a pixel portion having a plurality of pixels, a power source line, a buffer amplifier, a monitoring light emitting element, a constant current source, and an adding circuit, wherein each of the plurality of pixels includes a thin film transistor and a light emitting element, each of the monitoring light emitting element and the light emitting element includes a first electrode, a second electrode, and an organic compound layer disposed between the first electrode and the second electrode, the first electrode of the monitoring light emitting element is connected to the constant current source, the first electrode of the monitoring light emitting element is also connected to a non-inverted input terminal of the buffer amplifier, an output terminal of the buffer amplifier is connected to an input terminal of the adding circuit, an output terminal of the adding circuit is connected to the power source line, a constant potential difference is always maintained between the input terminal and the output terminal of the adding circuit, and in electrical potential of the power source line is applied to the first electrode of the light emitting element via the thin film transistor.

The present invention may be embodied in the form of a video camera, an image analog switch, and signals output from output terminals of the first analog switch and the second analog switch are output from the timing signal control circuit.

The present invention provides a display device having a pixel portion including a plurality of pixels and a source signal line driver circuit, wherein the source signal line driver circuit includes a shift register, a first latch, a second latch, and a start pulse signal control circuit, a start pulse signal is input into the shift register via the start pulse signal control circuit to thereby output a timing signal from the shift register, a digital video signal is input into and held at the first latch by the timing signal, the digital video signal held at the first latch is input into and held at the second latch by a latch signal, the digital video signal input into and held at the second latch is input into the plurality of pixels, and the start pulse signal control circuit reduces the number of bits of the digital video signal to be input into and held at the first latch by supplying to the shift register a constant fixed electrical potential instead of the start pulse for a constant period of time.

The above structure may be characterized in which the start pulse signal control circuit includes a NAND and an inverter, wherein a start pulse signal and a selection signal are input into the NAND, and a signal output from the NAND is output from the start pulse signal control circuit via the inverter.

The above structure may be characterized in which the start pulse signal control circuit includes a first analog switch, a second analog switch, and an inverter, wherein a selection signal is input via the inverter into a second control input terminal of the first analog switch and a first control input terminal of the second analog switch, the selection signal is input into a first control input terminal of the first analog switch and a second control input terminal of the second analog switch, a start pulse signal is input into an input terminal of the first analog switch, a fixed electrical potential is supplied to an input terminal of the second analog switch, and signals output from output terminals of the first analog switch and the second analog switch are output from the start pulse signal control circuit.

The present invention provides a display device including a plurality of pixels having a plurality of light emitting elements, and a monitoring light emitting element, wherein the reproduction apparatus, a head mount display, a portable telephone, or a portable information terminal employing the above-mentioned display device.

BRIEF DESCRIPTION OF THE DRAWINGS

FIGS. 23A through 23D are cross-sectional views for illustrating various steps of a fabricating method of a light emitting device.

FIGS. 24A through 24C are cross-sectional views for illustrating various steps of a fabricating method of a light emitting device.

FIGS. 25A through 25C are cross-sectional views for illustrating various steps of a fabricating method of a light emitting device.

DETAILED DESCRIPTION OF THE PREFERRED EMBODIMENTS

Embodiment Mode 1

Figure 1:
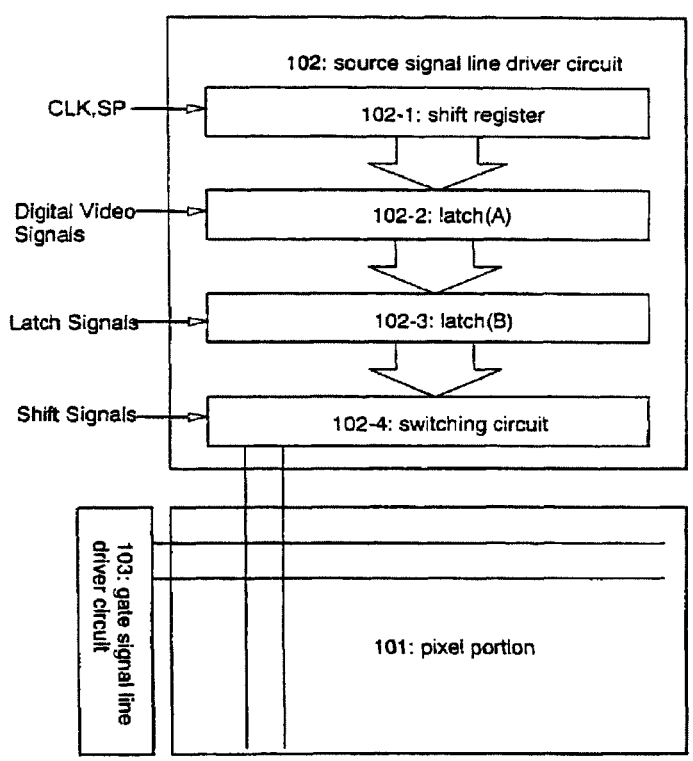
FIG. 1 is a block diagram of a light emitting device in accordance with the present invention.

A first structure in accordance with the present invention will be now described. FIG. 1 shows a block diagram of a light emitting device having the first structure in accordance with the present invention.

Reference numeral 101 denotes a pixel portion in which a plurality of pixels are provided in matrix. Reference numerals 102 and 103 denote a source signal line driver circuit and a gate signal line driver circuit, respectively.

The source signal line driver circuit 102 includes a shift register 102-1, a latch (A) 102-2, a latch (B) 102-3, and a switching circuit 102-4. It should be noted that the source signal line driver circuit of the present invention may further include a level shift, a buffer or the like, in addition to the components mentioned above.

Although not illustrated, the gate signal line driver circuit 103 includes a shift register and a buffer. In some cases, the gate signal line driver circuit 103 may further include a level shift in addition to the shift register and the buffer. Gate electrodes of pixel TFTs in one row are connected to one gate signal line, and therefore, all of the pixels TFTs in one row have to be simultaneously turned on. Accordingly, a buffer capable of allowing a large current to flow therethrough is used.

In the source signal line driver circuit 102, a clock signal (CLK) and a start pulse (SP) are input into the shift register 102-1. The shift register 102-1 sequentially generates a timing signal based on these clock signal (CLK) and start pulse (SP) and supplies the generated timing signal sequentially to a circuit in the succeeding stage.

The timing signal to be output from the shift register 102-1 may be sequentially supplied to the circuit in the succeeding stage through a buffer or the like (not illustrated). The timing signal from the shift register 102-1 is buffered and amplified by the buffer or the like. Since a number of circuits or elements are connected to a wiring to which the timing signal is to be supplied, a large load capacitance (parasitic capacitance) exists. In order to prevent a rising edge or a trailing edge of the timing signal from being rounded due to such a large load capacitance, the above-mentioned buffer is provided.

The timing signal output from the shift register 102-1 is supplied to the latch (A) 102-2. The latch (A) 102-2 includes latches in multiple stages for processing an n-bit digital video signal. When the timing signal is input to the latch (A) 102-2, it sequentially takes in the n-bit digital video signal to be externally supplied to the source signal line driver circuit 102 and held them therein.

When the digital video signal is taken in into the latch (A) 102-2, the digital video signal may be sequentially input into the latches in the multiple stages included in the latch (A) 102-2. However, the present invention is not limited to such a structure. A so-called division driving may be performed in which the latches in the multiple stages included in the latch (A) 102-2 are divided into several groups and the digital video signal is input every group in parallel and simultaneously. In such a case, the number of the groups is referred to as the division number. For example, in the case where the latches are divided into four groups, it can be said that the device is driven through the quarter-division scheme.

A time period required for completing all of the writing of the digital video signal into the latches in all of the stages of the latch (A) 102-2 is referred to as a line period. More specifically, the line period refers to a time period measured from a timing when the writing of the digital video signal into the latch in the leftmost stage in the latch (A) 102-2 starts until a timing when the writing of the digital video signal into the latch in the rightmost stage ends. In practice, the line period may include a horizontal blanking period in addition to the above-described line period.

After the one line period ends, latch signals are supplied to the latch (B) 102-3. At this moment, the digital video signal that has been written into and held at the latch (A) 102-2 is simultaneously sent out to the latch (B) 102-3 to be written into latches in all of the stages of the latch (B) 102-3 and held therein.

Further digital video signal to be externally supplied to the source signal line driver circuit 102 is again sequentially written, based on the timing signal from the shift register 102-1, into the latch (A) 102-2 from which the previous digital video signal was sent out to the latch (B) 102-3.

During the second turn of the one line period, the digital video signal that has been written into and held at the latch (B) 102-3 is simultaneously sent out to the switching circuit 102-4. The switching circuit 102-4 causes the polarity of the digital video signal input from the latch (B) 102-2 to be inverted, or alternatively allows the polarity of those digital video signal not to be inverted, in accordance with shift signals, and outputs the resultant signals.

The digital video signal includes information of either "0" or "1". The digital video signal corresponding to "0" is a signal having a Hi potential, while the digital video signal corresponding to "1" is a signal having a Lo potential, or vice versa. The inversion of the polarity of the digital video signal means that the digital video signal having information of "0" is converted into that having information of "1", while the digital video signal having information of "1" is converted into that having information of "0".

The shift signal is a signal to be used for selecting whether the polarity of the digital video signal input from the latch (B) 102-2 is to be inverted or not. The polarity of the digital video signal is inverted by the shift signal when an average of a time period during which all of the light emitting elements emit light in one frame period becomes longer than a half of a time period during which the light emitting elements emit light in one frame period in the case where the totally white is to be displayed in the pixel portion 101, thereby resulting in power consumption being reduced. On the other hand, when an average of the time period during which all of the light emitting elements emit light in one frame period becomes shorter than a half of the time period during which the light emitting elements emit light in one frame period in the case where the totally white is to be displayed in the pixel portion 101, the polarity of the digital video signal is not allowed to be inverted in accordance with the shift signal, for the purpose of suppressing the power consumption.

Whether the polarity of the digital video signal should be inverted or not in accordance with the shift signal may be chosen by a user, or alternatively, may be automatically chosen based on an image to be displayed.

The digital video signal output from the switching circuit 102-4 is input into the source signal lines.

On the other hand, in the gate signal line driver circuit 103, a gate signal from a shift register (not illustrated) is input into a buffer (not illustrated), and further input into a corresponding gate signal line (also referred to as a scanning line).

In accordance with the gate signal input into the gate signal line, the digital video signal input into the source signal lines is input into the pixels.

In the above description, the source signal line driver circuit 102 and the gate signal line driver circuit 103 may be provided on the same substrate as the pixel portion 101. Alternatively, those driver circuits 102 and 103 may be provided on an IC chip and connected to the pixel portion 101 via some techniques such as FPC or TAB.

In accordance with the above-mentioned structure of the present embodiment of the invention, in the case where the light emitting device for performing a digitally-driven time-divisional gradation display displays a monochrome image, the contrast of an image can be inverted based on natures of the image to be displayed in the pixel portion. More specifically, the contrast of the image to be displayed in the pixel portion is inverted when an average of a time period during which all of the light emitting elements emit light in one frame period becomes longer than a half of a time period during which the light emitting elements emit light in one frame period in the case where the totally white is to be displayed in the pixel portion 101. On the other hand, when an average of the time period during which all of the light emitting elements emit light in one frame period becomes shorter than a half of the time period during which the light emitting elements emit light in one frame period in the case where the totally white is to be displayed in the pixel portion 101, it is desirable that the contrast of the image to be displayed in the pixel portion is not allowed to be inverted.

In the above description of the present embodiment, the switching circuit is included in the source signal line driver circuit. Alternatively, it is acceptable that the switching circuit is not included in the source signal line driver circuit.

In the present embodiment mode, only the situation where the digital video signal is employed has been described. Alternatively, the present invention may be applied to the case where an analog video signal is used instead of the digital video signal.

Accordingly, the magnitude of a current to flow through the light emitting element can be suppressed to some extent in accordance with the first structure of the present invention, thereby resulting in the power consumption of the resultant light emitting device being suppressed.

Embodiment Mode 2

Figure 2:
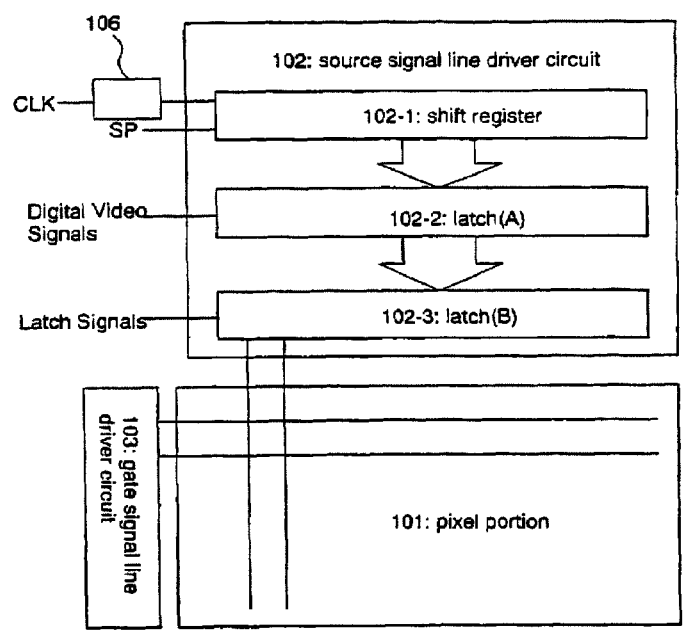
FIG. 2 is a block diagram of a light emitting device in accordance with the present invention.

A second structure in accordance with the present invention will be now described. FIG. 2 shows a block diagram of a light emitting device having the second structure in accordance with the present invention. In FIG. 2, the same components as shown in FIG. 1 are designated with the same reference numerals.

The light emitting device in the present embodiment mode employs a clock signal control circuit 106 which allows a constant electrical potential instead of the clock signal (CLK) to be applied to the shift register 102-1.

More specifically, the light emitting device is configured to input a constant electrical potential (fixed electrical potential) into the shift register 102-1, instead of the clock signal, for a constant time period by means of the clock signal control circuit 106. The above structure prevents the timing signal that is to be used for inputting the digital video signal at less significant bits in the range from the first bit to the m-th bit (m is any integer in the range from 1 to n) into the latch (A) 102-2 from being input into the latch (A) 102-2. Accordingly, only the digital video signal at more significant bits in the range from the (m+1)-th bit to the n-th bit can be written into the latch (A) 102-2.

The light emitting device in the present embodiment mode is different from that shown in FIG. 1 in that the source signal line driver circuit 102 does not include the switching circuit 102-4. Accordingly, the digital video signal that has been written into and held at the latch (B) 102-3 is input into the source signal lines by means of the latch signal to be input into the latch (B) 102-3.

In accordance with the present embodiment mode, in the light emitting device that performs a digitally-driven time-divisional gradation display, the digital video signal input into the source signal line driver circuit contained in the light emitting device is input into the pixel portion after the number of bits thereof is reduced. More specifically, the number of bits of the digital video signal to be input into the pixel portion is reduced by sequentially cutting off a bit of the digital video signal from the least significant bit.

In accordance with the above-described structure, the number of bits of the digital video signal to be input into the pixel portion is reduced, and therefore, the required number of writing the digital video signal into the pixels by means of the source signal line driver circuit and the gate signal line driver circuit can be reduced. Thus, the power consumption of the source signal line driver circuit and the gate signal line driver circuit can be suppressed, thereby resulting in the power consumption of the light emitting device being suppressed.

It should be noted that in the present embodiment mode, the clock signal control circuit 106 may be provided on the same substrate as the pixel portion 101, or alternatively, may be formed in an IC chip.

Embodiment Mode 3

Figure 3:
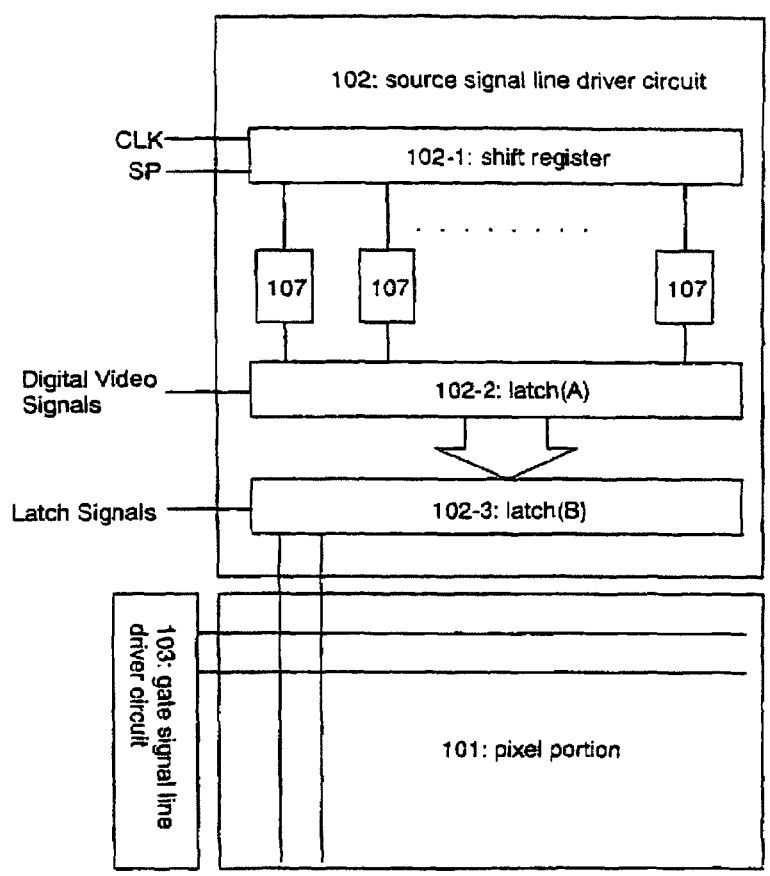
FIG. 3 is a block diagram of a light emitting device in accordance with the present invention.

Another example of the second structure in accordance with the present invention, which is different from the one described in Embodiment Mode 2, will be now described. FIG. 3 shows a block diagram of a light emitting device having the second structure in accordance with the present invention. In FIG. 3, the same components as shown in FIG. 1 are designated with the same reference numerals.

The light emitting device in the present embodiment mode employs a timing signal control circuit 107 which allows a constant electrical potential, instead of the timing signal output from the shift register 102-1, to be applied to the latch (A) 102-2.

More specifically, the light emitting device is configured to input a constant electrical potential (fixed electrical potential) into the latch (A) 102-2, instead of the timing signal output from the shift register 102-1, for a constant time period by means of the timing signal control circuit 107. The above structure prevents the timing signal that is to be used for inputting the digital video signal at less significant bits in the range from the first bit to the m-th bit (m is any integer in the range from 1 to n) into the latch (A) 102-2 from being input into the latch (A) 102-2. Accordingly, only the digital video signal at more significant bits in the range from the (m+1)-th bit to the n-th bit can be written into the latch (A) 102-2.

It should be noted that in the present embodiment mode, the fixed electrical potential is required to be at such a level that prevents the digital video signal from being written into the latch (A) 102-2.

In accordance with the present embodiment mode, in the light emitting device that performs a digitally-driven time-divisional gradation display, the digital video signal input into the source signal line driver circuit contained in the light emitting device is input into the pixel portion after the number of bits thereof is reduced. More specifically, the number of bits of the digital video signal to be input into the pixel portion is reduced by sequentially cutting off the bit of the digital video signal from the least significant bit.

In accordance with the above-described structure, the number of bits of the digital video signal to be input into the pixel portion is reduced, and therefore, the required number of writing the digital video signal into the pixels by means of the source signal line driver circuit and the gate signal line driver circuit can be reduced. Thus, the power consumption of the source signal line driver circuit and the gate signal line driver circuit can be suppressed, thereby resulting in the power consumption of the light emitting device being suppressed.

It should be noted that in the present embodiment mode, the timing signal control circuit 107 may be provided on the same substrate as the pixel portion 101, or alternatively, may be formed in an IC chip.

Embodiment Mode 4

Figure 4:
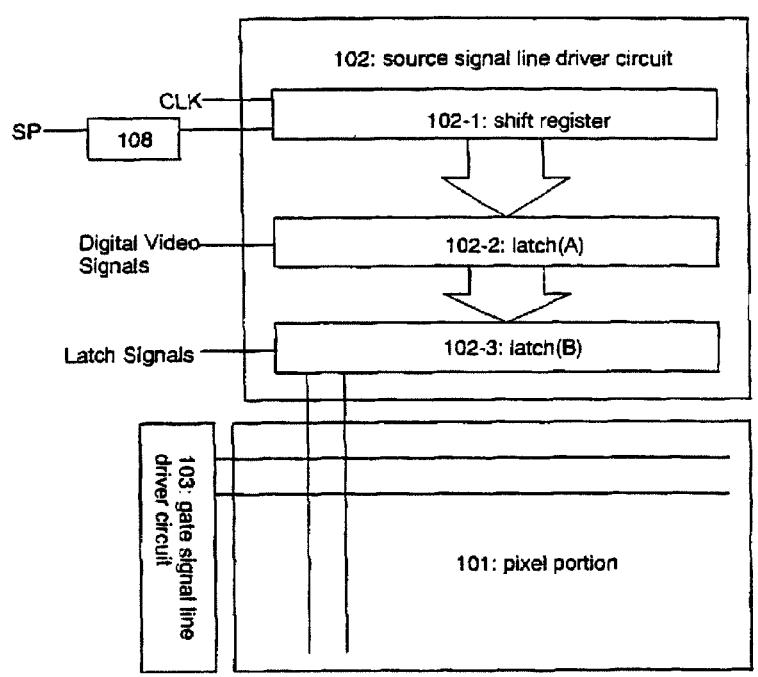
FIG. 4 is a block diagram of a light emitting device in accordance with the present invention.

Still another example of the second structure in accordance with the present invention, which is different from the ones described in Embodiment Modes 2 and 3, will be now described. FIG. 4 shows a block diagram of a light emitting device having the second structure in accordance with the present invention. In FIG. 4, the same components as shown in FIG. 1 are designated with the same reference numerals.

The light emitting device in the present embodiment mode employs a start pulse signal control circuit 108 which allows a constant electrical potential, instead of the start pulse signal (SP), to be applied to the shift register 102-1.

More specifically, the light emitting device is configured to input a constant electrical potential (fixed electrical potential) into the shift register 102-1, instead of the start pulse signal, for a constant time period by means of the start pulse signal control circuit 108, so that the timing signal that is to be used for inputting the digital video signal at less significant bits in the range from the first bit to the m-th bit (m is any integer in the range from 1 to n) into the latch (A) 102-2 is prevented from being input into the latch (A) 102-2. Accordingly, only the digital video signal at more significant bits in the range from the (m+1)-th bit to the n-th bit can be written into the latch (A) 102-2.

It should be noted that in the present embodiment mode, the fixed electrical potential is required to be at such a level that prevents the timing signal from being output from the shift register 102-1.

In accordance with the present embodiment mode, in the light emitting device that performs a digitally-driven time-divisional gradation display, the digital video signal input into the source signal line driver circuit contained in the light emitting device is input into the pixel portion after the number of bits thereof is reduced. More specifically, the number of bits of the digital video signal to be input into the pixel portion is reduced by sequentially cutting off the bit of the digital video signal from the least significant bit.

In accordance with the above-described structure, the number of bits of the digital video signal to be input into the pixel portion is reduced, and therefore, the required number of writing the digital video signal into the pixels by means of the source signal line driver circuit and the gate signal line driver circuit can be reduced. Thus, the power consumption of the source signal line driver circuit and the gate signal line driver circuit can be suppressed, thereby resulting in the power consumption of the light emitting device being suppressed.

It should be noted that in the present embodiment mode, the start pulse signal control circuit 108 may be provided on the same substrate as the pixel portion 101, or alternatively, may be formed in an IC chip.

Embodiment Mode 5

A third structure in accordance with the present invention will be now described with reference to FIG. 5.

Figure 5:
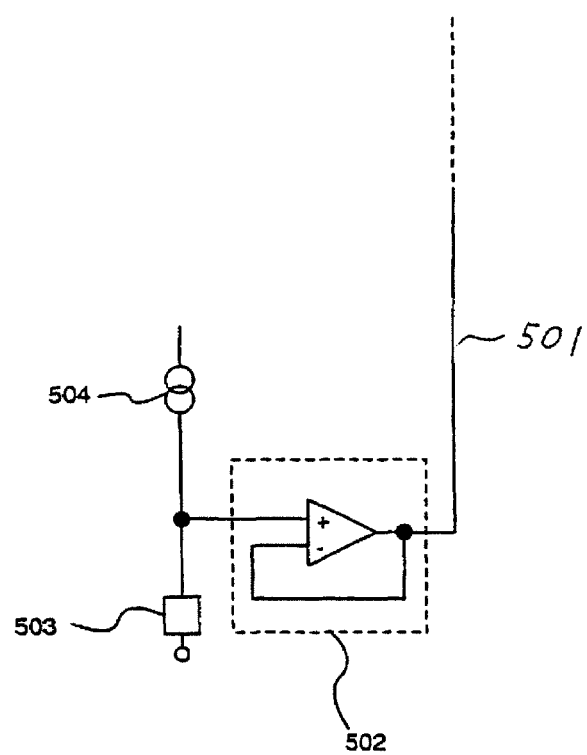
FIG. 5 is a diagram for illustrating connection of a monitoring light emitting element of a light emitting device in accordance with the present invention.

In FIG. 5, reference numeral 501 denotes a power source line. In the present specification, the power source line refers to a wiring to be used for applying a predetermined electrical potential to a pixel electrode contained in a light emitting element in a pixel section by means of the digital video signal to be input into a source signal line. In the present specification, the electrical potential of the power source line is referred to as the power source potential.

Reference numeral 502 denotes a buffer amplifier, reference numeral 503 denotes a monitoring light emitting element, and reference numeral 504 denotes a constant current source. One of electrodes of the monitoring light emitting element 503 is connected to the constant current source 504, so that a constant current always flows through the monitoring light emitting element 503. When a temperature of an organic compound layer contained in the light emitting element changes, the magnitude of the current to flow through the monitoring light emitting element 503 does not change, but rather, an electrical potential of the electrode of the monitoring light emitting element 503 connected to the constant current source 504 changes.

On the other hand, the buffer amplifier 502 includes two input terminals and one output terminal. One of the two input terminals is a non-inverted input terminal (+), while the other is an inverted input terminal (−). An electrical potential at one of electrodes of the monitoring light emitting element 503 is supplied to the buffer amplifier 502.

The buffer amplifier 502 is a circuit for preventing an electrical potential at a pixel electrode of the monitoring light emitting element 503 connected to the constant current source 504 changes in accordance with a load such as a wiring capacitance of the power source line 501 or the like. Accordingly, the electrical potential provided to the non-inverted input terminal of the buffer amplifier 502 is output from an output terminal to be supplied to the power source line as the power source potential, without being changed in accordance with a load such as a wiring capacitance of the power source line 501 or the like.

Accordingly, even when a temperature of the monitoring light emitting element 503 or the organic compound layer of the light emitting element in the pixel portion changes due to a change in an environmental temperature, the power source potential is changed so as to allow a constant current to flow through the light emitting element. Thus, even when the environmental temperature of the light emitting device increases, power consumption of the light emitting device can be prevented from increasing.

In the present embodiment mode, the buffer amplifier 502, the monitoring light emitting element 503, and the constant current source 504 may be provided on the same substrate as the pixel portion, or alternatively, may be formed in an IC chip. Moreover, the monitoring light emitting element 503 may be included in the pixel portion, or alternatively, may be provided independently of the pixel portion.

The present invention can suppress power consumption of a light emitting device and an electronic apparatus employing the light emitting device in accordance with the above-described first through third structures. It should be noted that only either one of the first through third structures is required to be included in the present invention, although two or all of the first through third structures may be included.

The present invention can allow power consumption of the light emitting device to be suppressed by means of the above-described three structures.

Embodiments

Several embodiments will be described below.

Embodiment 1

In the present embodiment, the structure of a pixel portion of a light emitting device and its driving method in accordance with the present invention will be described.

Figure 6:
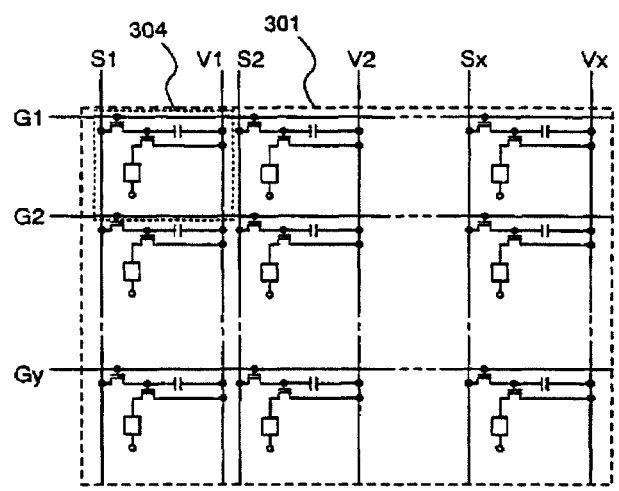
FIG. 6 is a diagram for illustrating a pixel portion of a light emitting device in accordance with the present invention.

FIG. 6 shows an expanded view of the pixel portion 301 of the light emitting device in accordance with the present embodiment of the invention. Source signal lines (S1 to Sx), power source lines (V1 to Vx), and gate signal lines (G1 to Gy) are provided in the pixel portion 301.

In the present embodiment, a pixel 304 refers to a region in which one of the source signal lines (S1 to Sx), one of the power source lines (V1 to Vx), and one of the gate signal lines (G1 to Gy) are provided. In the pixel portion 301, a plurality of the pixels 304 are arranged in matrix.

Figure 7:
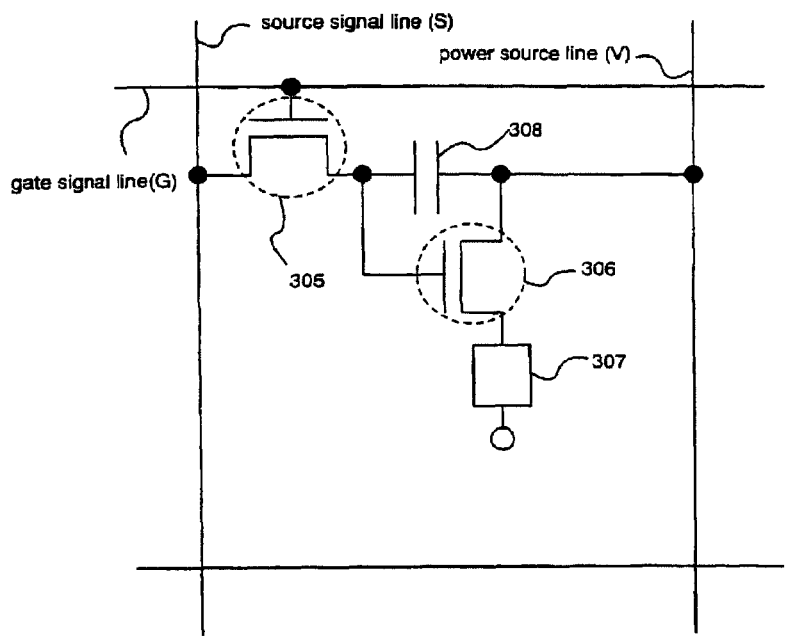
FIG. 7 is an expanded diagram of a pixel of a light emitting device in accordance with the present invention.

An expanded view of the pixel 304 is shown in FIG. 7. In FIG. 7, reference numeral 305 denotes a switching TFT. A gate electrode of the switching TFT 305 is connected to the gate signal line G (G1 to Gx). One of a source region and a drain region of the switching TFT 305 is connected to the source signal line S (S1 to Sx), while the other thereof is connected to a gate electrode 306 of a current-controlling TFT 306 as well as to a capacitor 308 of each pixels.

The capacitor 308 is provided for holding a gate potential of the current-controlling TFT 306 (an electrical potential difference between the gate electrode and the source region) when the switching TFT 305 is in the non-selected condition (off condition). Although the capacitor 308 is provided in the present embodiment, the present invention is not limited to such a structure. The capacitor 308 may be omitted.

One of the source region and the drain region of the current-controlling TFT 306 is connected to the power source line V (V1 to Vx), while the other is connected to the light emitting element 307. The power source line V is connected to the capacitor 308.

The light emitting element 307 is composed of an anode, a cathode, and an organic compound layer provided between the anode and the cathode. In the case where the anode is connected to the source region or the drain region of the current-controlling TFT 306, the anode functions as the pixel electrode and the cathode functions as a counter electrode. On the other hand, in the case where the cathode is connected to the source region or the drain region of the current-controlling TFT 306, the cathode functions as the pixel electrode and the anode functions as the counter electrode.

A counter potential is supplied to the counter electrode of the light emitting element 307. In addition, the power source potential is supplied to the power source line V. The power source potential and the counter potential are supplied to the light emitting device of the present invention by means of a power source provided by an externally-attached IC chip or the like.

The switching TFT 305 and the current-controlling TFT 306 may be either of the n-channel type TFT or the p-channel type TFT. It should be noted, however, that in the case where the source region or the drain region of the current-controlling TFT 306 is connected to the anode of the light emitting element 307, it is preferable that the current-controlling TFT 306 is the p-channel type TFT. On the other hand, in the case where the source region or the drain region of the current-controlling TFT 306 is connected to the cathode of the light emitting element 307, it is preferable that the current-controlling TFT 306 is the n-channel type TFT.

The switching TFT 305 and the current-controlling TFT 306 may have a multi-gate structure such as a double gate structure, a triple gate structure or the like, rather than a single gate structure.

Figure 8:
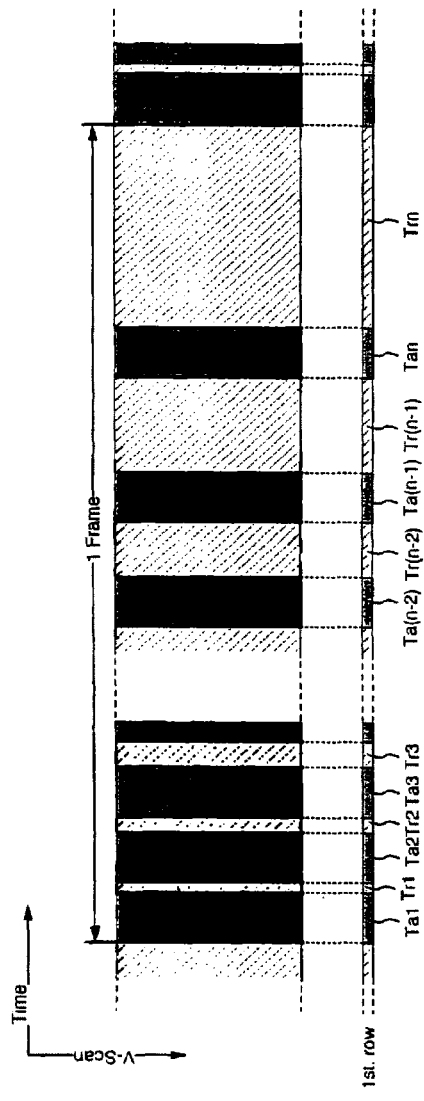
FIG. 8 is a diagram for illustrating a driving method of a light emitting device in accordance with the present invention.

Then, a driving method of the light emitting device of the present invention that includes the above-mentioned structure will be described with reference to FIG. 8.

First, the power source potential of the power source line becomes to be equal to an electrical potential of the counter electrode of the light emitting element. Then, a gate signal is input from the gate signal line driver circuit to the gate signal line G1. As a result, the switching TFTs 305 of all of the pixels connected to the gate signal line G1 (i.e., the pixels in the first row) are placed in the ON state.

Simultaneously, the digital video signal at the first bit is input from the source signal line driver circuit into the source signal lines (S1 to Sx). The digital video signal is input to the gate electrode of the current-controlling TFT 306 via the switching TFT 305.

Then, at the same time when the input of the gate signal into the G1 is completed, the similar gate signal is input into the next gate signal line G2. Thus, the switching TFTs 305 of all of the pixels connected to the gate signal line G2 (i.e., the pixels in the second row) are placed in the ON state, thereby the digital video signal at the first bit is input from the source signal lines (S1 to Sx) into the pixels in the second row.

Thereafter, the gate signal is sequentially input to all of the gate signal lines (G1 to Gx). A time period required for selecting all of the gate signal lines (G1 to Gx) and inputting the digital video signal at the first bit into the pixels in all of the rows is a writing period Ta1.

When the writing period Ta1 is completed, a light emitting period Tr1 then starts. During the light emitting period Tr1, the power source potential of the power source line comes to be at such a potential level that provides a potential difference with respect to the counter electrode, so that the light emitting element can emit light when the power source potential is supplied to the pixel electrode of the light emitting element.

In the present embodiment, in the case where the digital video signal has information of "0", the current-controlling TFT 306 is in the OFF state. Accordingly, the power source potential is not supplied to the pixel electrode of the light emitting element 307. As a result, the light emitting element 307 included in the pixel to which the digital video signal having information of "0" is supplied does not emit light.

On the other hand, in the case where the digital video signal has information of "1", the current-controlling TFT 306 is in the ON state. Accordingly, the power source potential supplied to the pixel electrode of the light emitting element 307. As a result, the light emitting element 307 included in the pixel to which the digital video signal having information of "1" is supplied emits light.

Thus, during the display period Tr1, the light emitting element 307 is placed either in the emission state or the non-emission state, so that all of the pixels perform a display operation. A time period during which the pixel performs the display operation is referred to as a display period Tr. More specifically, the display period that starts when the digital video signal at the first bit is input into the pixel is referred to as Tr1. In FIG. 8, only the display period of the pixels in the first row is illustrated for the purpose of simplification of the description. Timings at which the respective display periods for all of the rows start are the same.

When the display period Tr1 is completed, a next writing period Ta2 starts, and the power source potential of the power source line comes to be equal to the electrical potential of the counter electrode of the light emitting element. Similarly in the case of the writing period Ta1, all of the gate signal lines are sequentially selected, and the digital video signal at the second bit is input into all of the pixels. A time period required for completing the input of the digital video signal at the second bit into the pixels in all of the rows is referred to as a writing period Ta2.

When the writing period Ta2 is completed, a display period Tr2 then starts, and the power source potential of the power source line comes to be at such a potential level that provides a potential difference with respect to the counter electrode, so that the light emitting element can emit light when the power source potential is supplied to the pixel electrode of the light emitting element. Thus, all of the pixels perform the display operation.

The above-described operations are repeated until the digital video signal at the n-th bit is input into the pixels, so that the writing period Ta and the display period Tr appear alternately. After all of the display periods (Tr1 to Trn) are completed, one image can be displayed. In the driving method in accordance with the present invention, a time period required for displaying one image is referred to as one frame period (F). After a certain one frame period (F) is completed, the next one frame period is started. The writing period Ta1 again appears, and the above-described operations are repeated.

In a normal light emitting device, it is preferable to provide 60 or more frame periods per one second. If the number of images to be displayed in one second is smaller than 60, flickering of the image may become visually significant.

In the present embodiment, it is necessary that the sum of all of the writing periods is shorter than one frame period and ratios among the respective display periods are set to satisfy the relationship of $Tr1:Tr2:Tr3: \ldots :Tr(n-1):Trn = 2^0:2^1:2^2: \ldots :2^{(n-2)}:2^{(n-1)}$. Through the combination of the display periods, a desired gradation display among the total of $2^n$ gradations can be realized.

The gradation to be displayed by a particular pixel in a certain one frame period is determined by obtaining the sum of the display periods during which the light emitting element emits light in that frame period. For example, assuming that n=8 and the brightness obtained when the pixel emits light in all of the display periods is expressed as 100%, the brightness of 1% can be realized in the case where the pixel emits light in Tr1 and Tr2, while the brightness of 60% can be realized when Tr3, Tr5, and Tr8 are selected.

The display periods Tr1 through Trn may appear on any order. For example, during one frame period, the display periods may be controlled to appear in such an order that Tr1 is followed by Tr3, Tr5. Tr2 . . . .

Although the level of the power source potential at the power source line is changed by means of the writing period and the display period in the above description of the present embodiment, the present invention is not limited thereto. A potential difference which allows the light emitting element to emit light when the power source potential is supplied to the pixel electrode of the light emitting element may be controlled to always exist between the power source potential and the electrical potential at the counter electrode. In such a case, the light emitting element can emit light even in the writing period. Accordingly, the gradation to be displayed by a particular pixel in a certain frame period is determined by the sum of the writing periods and the display periods during which the light emitting element emits light in that frame period. In this case, it is necessary that the sum of the writing periods and the display periods corresponding to the digital video signal at the respective bits is set to satisfy the relationship of $(Ta1+Tr1):(Ta2+Tr2):(Ta3+Tr3): \ldots :(Ta(n-1)+Tr(n-1)):(Tan+Trn) = 2^0:2^1:2^2: \ldots :2^{(n-2)}:2^{(n-1)}$.

Embodiment 2

In the present embodiment, another example of the structure of a pixel portion of a light emitting device and its driving method in accordance with the present invention, different from those in the Embodiment 1, will be described.

Figure 9:
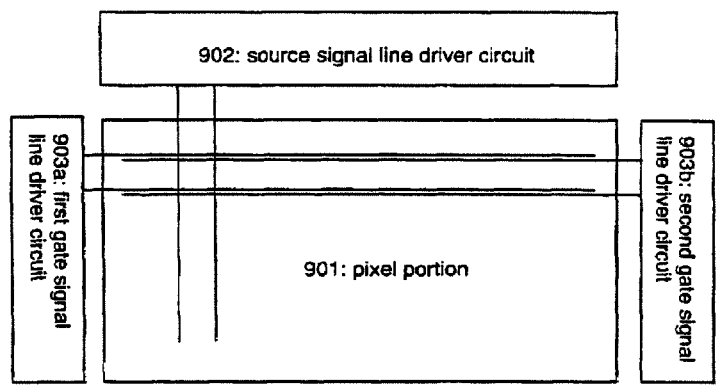
FIG. 9 is a block diagram of a light emitting device in accordance with the present invention.

FIG. 9 shows an exemplary block diagram of a light emitting device in the present embodiment. The light emitting device in FIG. 9 includes a pixel portion 901 by TFT formed on the substrate and includes a source signal side driver circuit 902, a writing gate signal side driver circuit (first gate signal line driver circuit) 903a, and an erasure gate signal line driver circuit (second gate signal line driver circuit) 903b, each provided in the periphery of the pixel portion. Although the light emitting device with one source signal side driver circuit is described in the present embodiment, two of the source signal side driver circuits may be provided.

The source signal side driver circuit 902 has at least one of the first through third structures of the present invention described previously.

In the present embodiment, the source signal line driver circuit 902 and the writing gate signal side driver circuit 903a and the erasure gate signal line driver circuit 903b may be provided on the same substrate as the pixel portion 901, or alternatively, may be formed on an IC chip and connected to the pixel portion 901 via a certain connector such as FPC, TAB or the like.

Figure 10:
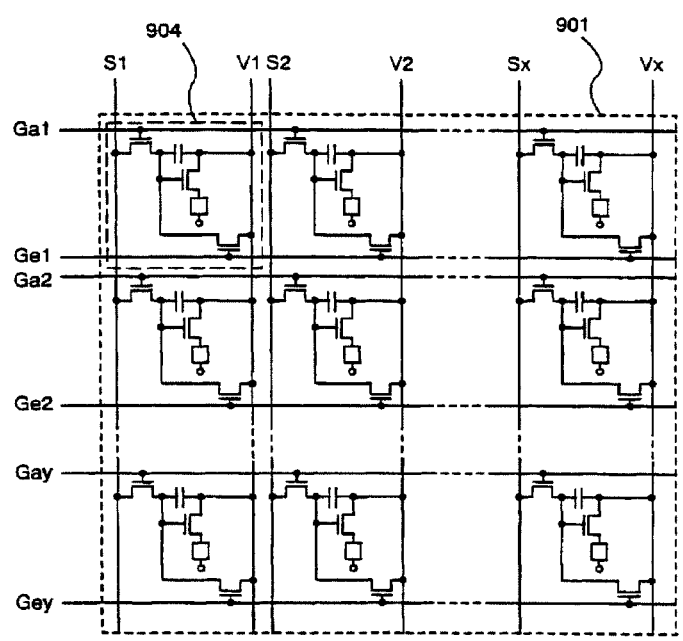
FIG. 10 is a diagram for illustrating a pixel portion of a light emitting device in accordance with the present invention.

An expanded view of the pixel portion 901 is shown in FIG. 10. In FIG. 10, source signal lines (S1 to Sx), power source lines (V1 to Vx), and writing gate signal lines (first gate signal lines) (Ga1 to Gay), and erasure gate signal lines (second gate signal lines) (Ge1 to Gey) are provided in the pixel portion 901.

The pixel 904 refers to a region in which one of the source signal lines (S1 to Sx), one of the power source lines (V1 to Vx), one of the writing gate signal lines (Ga1 to Gay), and one of the erasure gate signal lines (Ge1 to Gey) are provided. In the pixel portion 901, a plurality of the pixels 904 are arranged in matrix.

Figure 11:
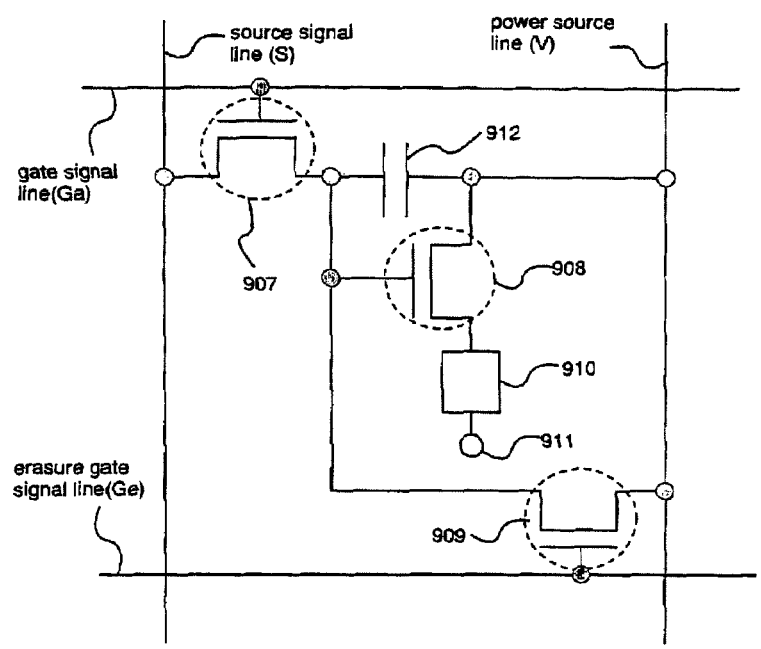
FIG. 11 is an expanded diagram of a pixel of a light emitting device in accordance with the present invention.

An expanded view of the pixel 904 is shown in FIG. 11. In FIG. 11, reference numeral 907 denotes the switching TFT. A gate electrode of the switching TFT 907 is connected to the gate signal line Ga (Ga1 to Gay). One of a source region and a drain region of the switching TFT 907 is connected to the source signal line S (S1 to Sx), while the other thereof is connected to a gate electrode of a current-controlling TFT 908 as well as to a capacitor 912 and source and drain regions of an erasure TFT 909 included in each pixels.

The capacitor 912 is provided for holding a gate potential of the current-controlling TFT 908 when the switching TFT 907 is in the non-selected condition (off condition). Although the capacitor 912 is provided in the present embodiment, the present invention is not limited to such a structure. The capacitor 912 may be omitted.

One of the source region and the drain region of the current-controlling TFT 908 is connected to the power source line V (V1 to Vx), while the other thereof is connected to the light emitting element 910. The power source line V is connected to the capacitor 912.

One of the source region and the drain region of the erasure TFT 909 that is not connected to the source or drain region of the switching TFT 907 is connected to the power source line V. A gate electrode of the erasure TFT 909 is connected to the erasure gate signal line Ge.

The light emitting element 910 is composed of an anode, a cathode, and an organic compound layer provided between the anode and the cathode. In the case where the anode is connected to the source region or the drain region of the current-controlling TFT 908, the anode functions as the pixel electrode and the cathode functions as a counter electrode. On the other hand, in the case where the cathode is connected to the source region or the drain region of the current-controlling TFT 908, the cathode functions as the pixel electrode and the anode functions as the counter electrode.

A counter potential is supplied to the counter electrode 911 of the light emitting element 910. In addition, the power source potential is supplied to the power source line V. A potential difference between the counter potential and the power source potential is always maintained at such a level that causes the light emitting element to emit light when the power source potential is applied to the pixel electrode. The power source potential and the counter potential are supplied to the light emitting device of the present invention by means of a power source provided by an externally-attached IC chip or the like.

In the typical light emitting device to date, when the amount of light emission per unit light emission area of a pixel is 200 cd/m², a current of several mA/cm² per unit area of a pixel portion is required to flow. Thus, especially with a larger display area, it becomes difficult to control the magnitude of the electrical potential to be supplied from the power source provided in the IC chip by means of a switch. In the present embodiment, the power source potential and the counter potential are always maintained to be constant, and therefore, the magnitude of the electrical potential to be supplied from the power source provided in the IC chip is not required to be controlled by means of a switch. Accordingly, the present embodiment is useful for realizing a panel having a larger display size.

The switching TFT 907, the current-controlling TFT 908, and the erasure TFT 909 may be either of the n-channel type TFT or the p-channel type TFT. It should be noted, however, that in the case where the source region or the drain region of the current-controlling TFT 908 is connected to the anode of the light emitting element 910, it is preferable that the current-controlling TFT 908 is the p-channel type TFT. On the other hand, in the case where the source region or the drain region of the current-controlling TFT 908 is connected to the cathode of the light emitting element 910, it is preferable that the current-controlling TFT 908 is the n-channel type TFT.

The switching TFT 907, the current-controlling TFT 908, and the erasure TFT 909 may have a multi-gate structure such as a double gate structure, a triple gate structure or the like, rather than a single gate structure.

Then, a driving method of the light emitting device of the present invention that includes the above-mentioned structure will be described with reference to FIG. 12.

First, a writing gate signal is input from the writing gate signal line driver circuit 903*a* to the writing gate signal line Ga, and thus, the switching TFTs 907 of all of the pixels connected to the writing gate signal line Ga1 (i.e., the pixels in the first row) are placed in the ON state. In the present specification, when all of the TFTs having a gate electrode connected to a certain signal line, the signal line is referred to as being selected. Thus, in the above-described case, the writing gate signal line Ga1 is being selected.

Simultaneously, the digital video signal at the first bit is input from the source signal line driver circuit 902 into the source signal lines (S1 to Sx). More specifically, the digital video signal is input to the gate electrode of the current-controlling TFT 908 via the switching TFT 907.

In the present embodiment, in the case where the digital video signal has information of "0", the current-controlling TFT 908 is in the OFF state. Accordingly, the power source potential is not supplied to the pixel electrode of the light emitting element 910. As a result, the light emitting element 910 included in the pixel to which the digital video signal having information of "0" is supplied does not emit light.

On the other hand, in the case where the digital video signal has information of "1", the current-controlling TFT 908 is in the ON state. Accordingly, the power source potential is supplied to the pixel electrode of the light emitting element 910. As a result, the light emitting element 910 included in the pixel to which the digital video signal having information of "1" is supplied emits light.

Thus, at the same time when the digital video signal is input into the pixels in the first row, the light emitting element is placed either in the emission state or the non-emission state, so that all of the pixels in the first row perform a display operation. A time period during which the pixel performs the display operation is referred to as a display period Tr. More specifically, the display period that starts when the digital video signal at the first bit is input into the pixel is referred to as Tr1. In FIG. 12, only the display period of the pixels in the first row is illustrated for the purpose of simplification of the description. Timings at which the display periods for the respective rows start are offset from each other by a certain time difference.

Then, at the same time when the selection of the Ga1 is completed, the next writing gate signal line Ga2 is selected by the writing gate signal. Thus, the switching TFTs 907 of all of the pixels connected to the writing gate signal line Ga2 are placed in the ON state, thereby the digital video signal at the first bit is input from the source signal lines (S1 to Sx) into the pixels in the second row.

Thereafter, all of the writing gate signal lines (Ga1 to Gax) are sequentially selected. A time period required for selecting all of the writing gate signal lines (Ga1 to Gax) and inputting the digital video signal at the first bit into the pixels in all of the rows is a writing period Ta1.

On the other hand, before the digital video signal at the first bit is input into the pixels in all of the rows, in other words, before the writing period Ta1 is completed, the erasure gate signal line Ge1 is selected by an erasure gate signal to be input from the erasure gate signal line driver circuit 903*b*, in parallel to the input of the digital video signal of the first bit into the pixels.

When the erasure gate signal line Ge1 is selected, the erasure TFTs 909 in all of the pixels connected to the erasure gate signal line Ge1 (the pixels in the first row) are placed in the ON state. Thus, the power source potential of the power source line (V1 to Vx) is supplied to the gate electrodes of the current-controlling TFTs 908 in the pixels in the first row.

When the power source potential is supplied to the gate electrodes of the current-controlling TFTs 908, the current-controlling TFTs 908 are placed in the OFF state. Thus, the power source potential is not supplied to the pixel electrodes of the light emitting elements 910, so that all of the light emitting elements included in the pixels in the first row are placed in the non-emission state. Thus, the pixels in the first row do not performs a display operation. In other words, the digital video signal that has been held at the gate electrode of the current-controlling TFT since the selection of the writing gate signal line Ga1 is erased when the power source potential is supplied to the gate electrode of the current-controlling TFT. Thus, the pixels in the first row do not performs a display operation.

A time period during which the pixel does not perform a display operation is referred to as a non-display period Td. The display period Tr1 for the pixels in the first row is completed simultaneously when the erasure gate signal is input into the erasure gate signal line Ge1, and the non-display period Td1 starts.

Figure 12:
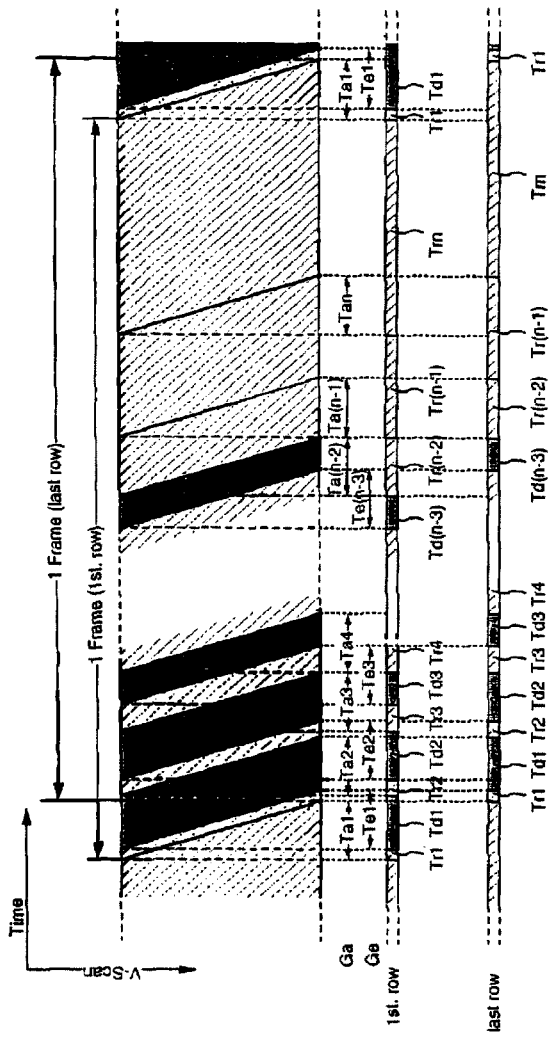
FIG. 12 is a diagram for illustrating a driving method of a light emitting device in accordance with the present invention.

In FIG. 12, only the non-display period for the pixels in the first row is particularly illustrated for the purpose of simplification of the description. Timings at which the non-display periods for the respective rows start are offset from each other by a certain time difference.

Then, at the same time when the selection of the Ge1 is completed, the next erasure gate signal line Ge2 is selected by the erasure gate signal. Thus, the erasure TFTs 909 of all of the pixels connected to the erasure gate signal line Ge2 (the pixels in the second row) are placed in the ON state. The power source potential of the power source lines (V1 to Vx) is supplied to the gate electrode of the current-controlling TFT 908 via the erasure TFT 909. When the power source potential is supplied to the gate electrode of the current-controlling TFT 908, the current-controlling TFT 908 is placed in the OFF state. Thus, the power source potential is not supplied to the pixel electrode of the light emitting element 910, so that all of the light emitting elements included in the pixels in the second row are placed in the non-emission state. Thus, the pixels in the second row do not performs a display operation and are placed in the non-display state.

Then, all of the erasure gate signal lines are sequentially selected by the erasure gate signal. A time period required for selecting all of the erasure gate signal lines (Ga1 to Gax) and erasing the digital video signal at the first bit held in the pixels in all of the rows is referred to as the erasure period Te1.

On the other hand, before the digital video signal at the first bit held in the pixels in all of the rows is erased, in other words, before the erasure period Te1 is completed, the writing gate signal line Ga1 is again selected, in parallel to the erasure of the digital video signal at the first bit in the pixels. Thus, the pixels in the first row again perform the display operation. The non-display period Td1 is thus completed, and a display period Tr2 starts.

Thereafter, all of the writing gate signal lines are sequentially selected in the similar manner as described before, and the digital video signal at the second bit is input into all of the pixels. A time period required for inputting the digital video signal at the second bit into the pixels in all of the rows is referred to as a writing period Ta2.

On the other hand, before the digital video signal at the second bit is input into the pixels in all of the rows, in other words, before the writing period Ta2 is completed, the erasure gate signal line Ge2 is selected in parallel to the input of the digital video signal at the second bit into the pixels. Thus, all of the light emitting elements included in the pixels in the first row are placed in the non-emission state. Thus, the pixels in the first row do not perform a display operation. The display period Tr2 for the pixels in the first row is then completed, and the non-display period Td2 starts.

Thereafter, all of the erasure gate signal lines are sequentially selected. A time period required for selecting all of the erasure gate signal lines (Ga1 to Gax) and erasing the digital video signal at the second bit held at the pixels in all of the rows is an erasure period Te2.

The above-described operations are repeated until the digital video signal at the m-th bit is input into the pixels, so that the display period Tr and the non-display period Td appear alternately. The display period Tr1 is a period from the start of the writing period Ta1 until the erasure period Te1 starts. The non-display period Td1 is a period from the start of the erasure period Te1 until the display period Tr2 starts. Similarly as the display period Tr1 and the non-display period Td1, lengths of the display periods Tr2, Tr3, . . . , Tr(m−1) and the non-display periods Td2, Td3, . . . , Td(m−1) are defined by means of the writing periods Ta1, Ta2, . . . , Tam and the erasure periods Te1, Te2, . . . , Te(m−1).

After the digital video signal at the m-th bit has been input into the pixels in the first row, the erasure gate signal line Ge1 is not selected. For the purpose of simplification of the description, the case with m=n−2 is described as an example in the present embodiment. However, the present invention is not limited to such a case. In the present invention, as the value of m, any number in the range from 2 to n can be arbitrarily selected.

When the digital video signal at the (n−2)-th bit is input into the pixels in the first row, the pixels in the first row are placed in the display period Tr(n−2) to perform a display operation. Until the next digital video signal at the next bit is input, the digital video signal at the (n−2)-th bit is held at the pixels.

When the digital video signal at the (n−1)-th bit is input into the pixels in the first row, the digital video signal at the (n−2)-th bit held at the pixels are rewritten into the digital video signal at the (n−1)-th. The pixels in the first bit are then placed in the display period Tr(n−1) to perform a display operation. Until the next digital video signal at the next bit is input, the digital video signal at the (n−2)-th bit is held at the pixels.

The above-described operations are repeated until the digital video signal at the n-th bit is input into the pixels. The display period Tr(n−2) is a period from the start of the writing period Ta(n−2) until the writing period Ta(n−1) starts. Similarly as the display period Tr(n−2), lengths of the display periods Tr(n−1) and Trn are defined by means of the writing period Ta.

In the present embodiment, it is necessary that the sum of all of the writing periods is shorter than one frame period and ratios among the respective display periods are set to satisfy the relationship of Tr1:Tr2:Tr3: . . . :Tr(n−1):Trn=$2^0:2^1:2^2: \ldots :2^{(n-2)}:2^{(n-1)}$. Through the combination of the display periods, a desired gradation display among the total of $2^n$ gradations can be realized.

After all of the display periods (Tr1 through Trn) are completed, one image can be displayed. In the driving method in accordance with the present invention, a time period required for displaying one image is referred to as one frame period (F).

After a certain one frame period (F) is completed, the digital video signal at the first bit is again input into the pixels, so that the pixels in the first row are again placed in the display period Tr1. The above-mentioned operations are again repeated.

In a normal light emitting device, it is preferable to provide 60 or more frame periods per one second. If the number of images to be displayed in one second is smaller than 60, flickering of the image may become visually significant.

The gradation to be displayed by a particular pixel in a certain one frame period is determined by obtaining the sum of the display periods during which the light emitting element emits light in that frame period. For example, assuming that n=8 and the brightness obtained when the pixel emits light in all of the display periods is expressed as 100%, the brightness of 1% can be realized in the case where the pixel emits light in Tr1 and Tr2, while the brightness of 60% can be realized when Tr3, Tr5, and Tr8 are selected.

The writing period Tam during which the digital video signal at the m-th bit is input into the pixels is required to be shorter than the display period Trm. Accordingly, the number of bits m is required to be such a number from 1 to n that can allow the writing period Tam to be shorter than the display period Trm.

The display periods (Tr1 through Trn) may appear on any order. For example, during one frame period, the display periods may be controlled to appear in such an order that Tr1 is followed by Tr4, Tr3, Tr2, . . . . It should be noted, however, that the appearing order of the display periods is preferably set so as not to cause the erasure periods (Te1 through Ten) to be overlapped with each other.

In the present embodiment, the display period Tr and the writing period Ta are partially overlapped with each other. In other words, the pixels can perform a display operation even during the writing period. Accordingly, a ratio of the sum of the display periods within one frame period (duty ratio) is not determined only by the length of the writing period.

Embodiment 3

Figure 13:
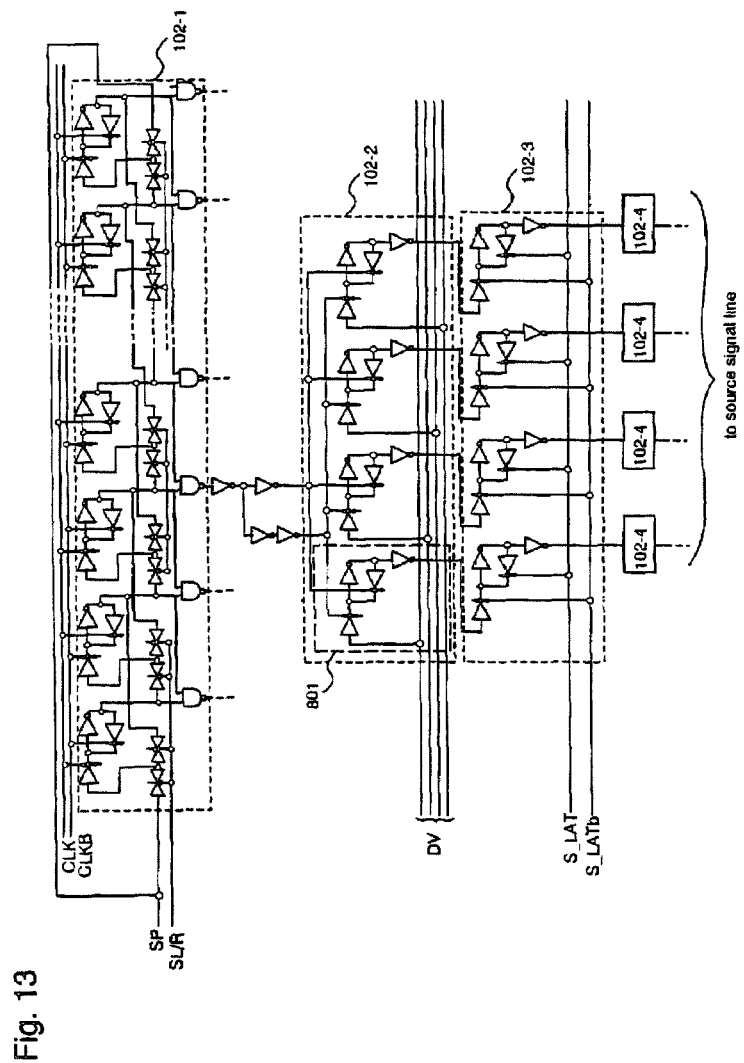
FIG. 13 is a circuit diagram of a source signal line driver circuit of a light emitting device in accordance with the present invention.

In the present embodiment, the structure of the source signal line driver circuit contained in the light emitting device as described in Embodiment 1 will be described in detail. FIG. 13 shows a circuit diagram of the source signal line driver circuit in the present embodiment. In FIG. 13, the same components as those shown in FIG. 1 are designated with the same reference numerals.

Reference numeral 102-1 denotes a shift register, to which a clock signal (CLK), a signal (CLKB) obtained by inverting the polarity of the clock signal, a start pulse signal (SP), a bi-direction shift signal (SIR) are input through the illustrated wirings, respectively.

Reference numerals 102-2 and 102-3 denote a latch (A) and a latch (B), respectively. In the present embodiment, a combination of the latches (A) 102-2 and a combination of the latches (B) 102-3 corresponds to four source signal lines. However, the number of source signal lines to which a combination of the latches (A) 102-2 and a combination of the latches (B) 102-3 corresponds is not limited to the above number in the present embodiment. In addition, although a level shift for changing a width of a voltage amplitude of a signal is not provided in the present embodiment, such a level shift may be appropriately provided by a designer.

The digital video signal (DV) to be supplied externally to the source signal line driver circuit is input into the latch (A) 102-2 through the illustrated wirings. A latch signal S_LAT and a signal S_LATb obtained by inverting the polarity of the S_LAT are respectively input into the latch (B) 102-3 through the illustrated wirings.

The structure of the latch (A) 102-2 will be described in detail with reference to a portion 801 of the latch (A) 102-2. The portion 801 of the latch (A) 102-2 includes two clocked inverters and two inverters.

Figure 14:
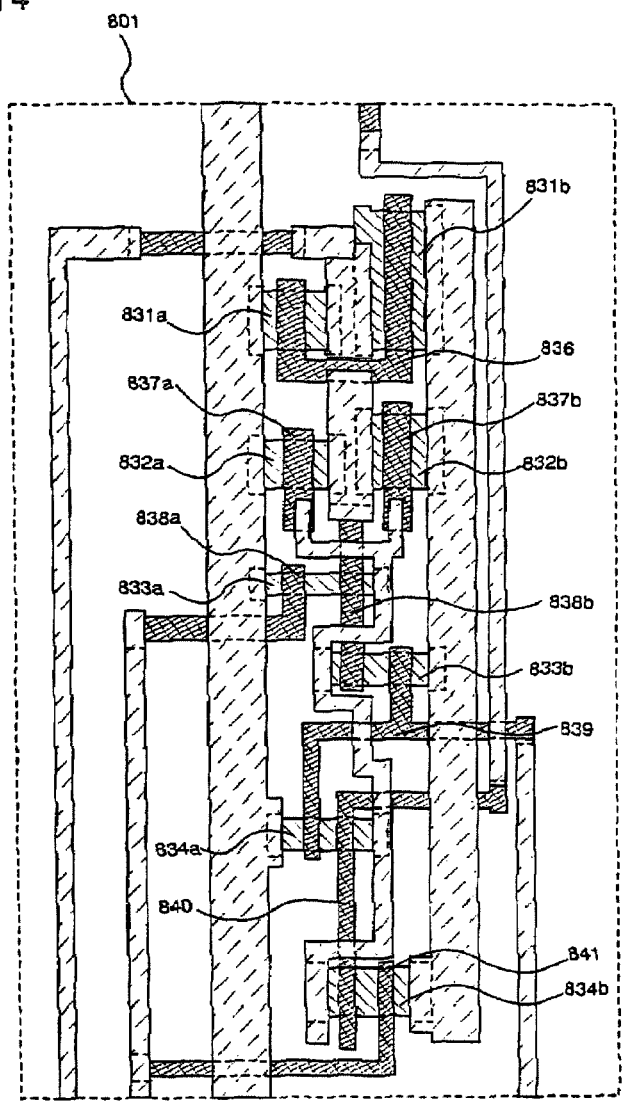
FIG. 14 is a partial plan view of a latch (A).

A plan view of the portion 801 of the latch (A) 102-2 is shown in FIG. 14. Reference numerals 831a and 831b respectively denote active layers of TFTs that constitute one of the inverters included in the portion 801 of the latch (A) 102-2. Reference numeral 836 denotes a common gate electrode of the TFTs that constitute the particular one of the inverters. Reference numerals 832a and 832b respectively denote active layers of TFTs that constitute the other one of the inverters included in the portion 801 of the latch (A) 102-2. Reference numerals 837a and 837b denote gate electrodes formed over the active layers 832a and 832b, respectively. The gate electrodes 837a and 837b are electrically connected to each other.

Reference numerals 833a and 833b respectively denote active layers of TFTs that constitute one of the clocked inverters included in the portion 801 of the latch (A) 102-2. Gate electrodes 838a and 838b are provided over the active layer 833a to form a double gate structure. Similarly, gate electrodes 838b and 839 are provided over the active layer 833b to form a double gate structure.

Reference numerals 834a and 834b respectively denote active layers of TFTs that constitute the other one of the clocked inverters included in the portion 801 of the latch (A) 102-2. Gate electrodes 839 and 840 are provided over the active layer 834a to form a double gate structure. Similarly, gate electrodes 840 and 841 are provided over the active layer 834b to form a double gate structure.

Figure 15A:
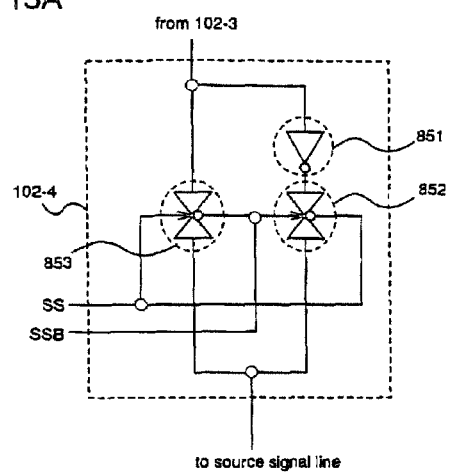
FIGS. 15A and 15B are circuit diagrams of a switching circuit.
Figure 15B:
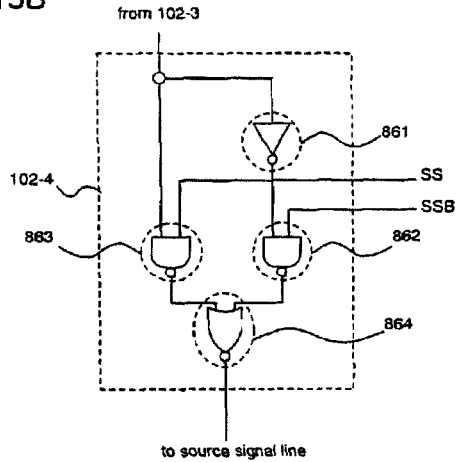

Reference numeral 102-4 denotes the switching circuit. FIGS. 15A and 15B shows circuit diagrams of the switching circuit in accordance with the present embodiment.

The switching circuit 102-4 of the present embodiment as shown in FIG. 15A includes an inverter 851, a first analog switch 852, and a second analog switch 853. A shift signal SS and a signal SSB obtained by inverting the polarity of the shift signal SS are input through the illustrated wirings.

Figure 16:
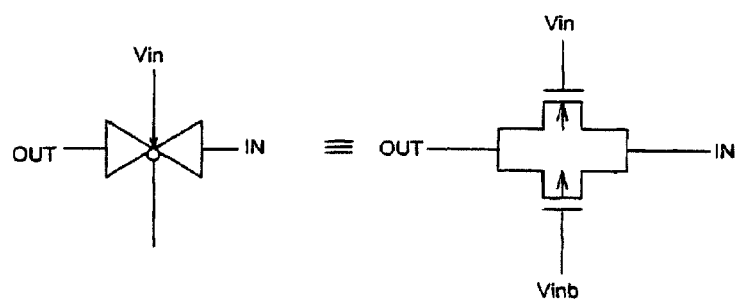
FIG. 16 is an equivalent circuit diagram of an analog switch.

Equivalent circuit diagrams of the first analog switch 852 and the second analog switch 853 are shown in FIG. 16. Each of the first analog switch 852 and the second analog switch 853 includes an n-channel type TFT and a p-channel type TFT. A signal to be input from an input terminal (IN) is sampled by means of a signal to be input from a first control input terminal (Vin) or a second control input terminal (Vinb), and the resultant signals is output from an output terminal (OUT).

The digital video signal from the latch (B) 102-3 is input via the inverter 851 into the first analog switch 852 through the input terminal (IN). Simultaneously, the digital video signal from the latch (B) 102-3 is input into the second analog switch 853 through the input terminal (IN).

The shift signal SS and the signal SSB obtained by inverting the polarity of the shift signal SS are input into the first analog switch 852 and the second analog switch 853, respectively, through the first control input terminal (Vin) or the second control input terminal (Vinb). The digital video signal is sampled by this shift signal SS, and the sampled digital video signal is output from output terminals (OUT) of the first analog switch 852 and the second analog switch 853.

The digital video signal input into the switching circuit 102-4 is output therefrom after the polarity thereof is inverted, or alternatively, without having the polarity inverted. The shift signal SS determines whether the polarity of the digital video signal is to be inverted or not in the switching circuit 102-4.

The switching circuit 102-4 as shown in FIG. 15B includes an inverter 861, a first NAND 862, a second NAND 863, and NOR 864. A shift signal SS and a signal SSB obtained by inverting the polarity of the shift signal SS are input through the illustrated wirings.

The digital video signal from the latch (B) 102-3 is provided through the inverter 861. Simultaneously, the signal SSB obtained by inverting the polarity of the shift signal SS is input into the first NAND 862.

Simultaneously with the input of the digital video signal into the first NAND 862 through the inverter 861, the digital video signal is also input into the second NAND 863. Simultaneously, the shift signal SS is also input into the second NAND 863.

Signals output from the first NAND 862 and the second NAND 863 are simultaneously input into the NOR 864. A signal output from the NOR 864 is input into the source signal line.

The digital video signal input into the switching circuit 102-4 is output therefrom after the polarity thereof is inverted, or alternatively, without having the polarity inverted. The shift signal SS determines whether the polarity of the digital video signal is to be inverted or not in the switching circuit 102-4.

The structure of the switching circuit is not limited to those shown in FIGS. 15A and 15B. The switching circuit may have any appropriate structure as long as it can allow the digital video signal input thereto to be output therefrom with either the inverted polarity or the non-inverted polarity.

The present embodiment can be freely combined with Embodiments 1 or 2.

Embodiment 4

Figure 17:
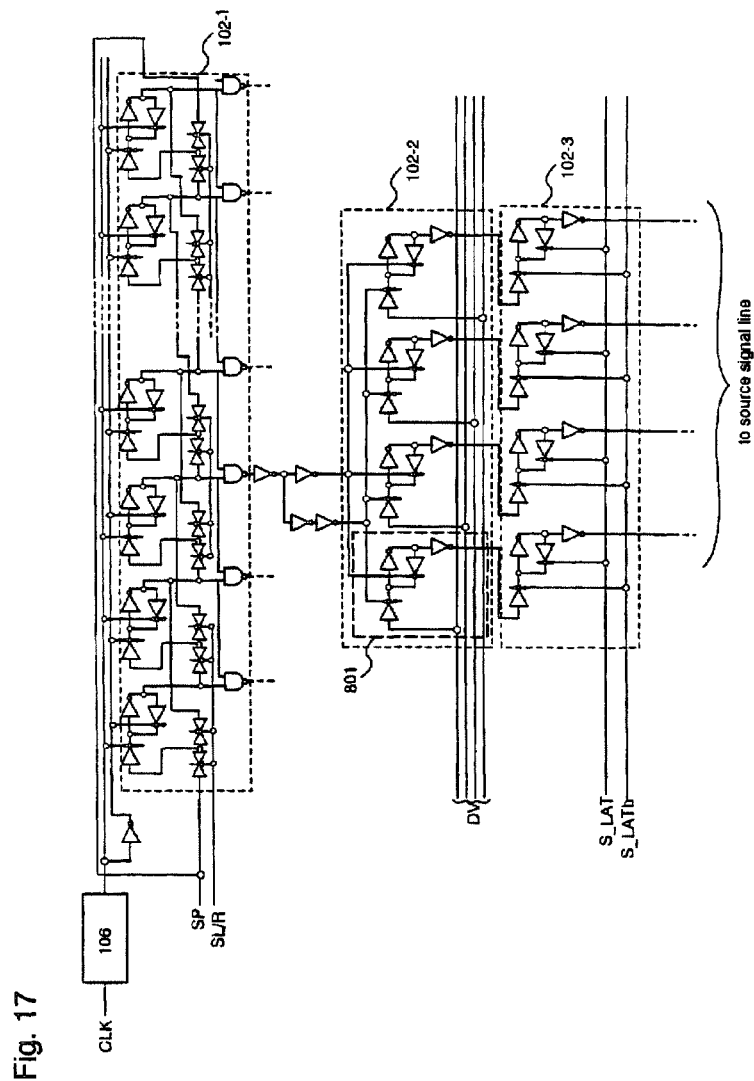
FIG. 17 is a circuit diagram of a source signal line driver circuit of a light emitting device in accordance with the present invention.

In the present embodiment, the structure of the source signal line driver circuit contained in the light emitting device as described in Embodiment 2 will be described in detail. FIG. 17 shows a circuit diagram of the source signal line driver circuit in the present embodiment. In FIG. 17, the same components as those shown in FIG. 1 are designated with the same reference numerals.

Reference numeral 102-1 denotes a shift register, to which a clock signal (CLK), a signal (CLKB) obtained by inverting the polarity of the clock signal, a start pulse signal (SP), a bi-direction shift signal (SL/R) are input through the illustrated wirings, respectively.

Reference numerals 102-2 and 102-3 denote a latch (A) and a latch (B), respectively. In the present embodiment, a combination of the latches (A) 102-2 and a combination of the latches (B) 102-3 correspond to four source signal lines. However, the number of source signal lines to which a combination of the latches (A) 102-2 and a combination of the latches (B) 102-3 correspond is not limited to the above number in the present embodiment. In addition, although a level shift for changing a width of a voltage amplitude of a signal is not provided in the present embodiment, such a level shift may be appropriately provided by a designer.

The digital video signal (DV) to be supplied externally to the source signal line driver circuit is input into the latch (A) 102-2 through the illustrated wirings. A latch signal S_LAT and a signal S_LATb obtained by inverting the polarity of the S_LAT are respectively input into the latch (B) 102-3 through the illustrated wirings.

The detailed structure of the latch (A) 102-2 is the same as that shown in FIG. 14. Accordingly, the description thereof is omitted here.

Reference numeral 106 denotes the clock signal control circuit, that can supply a constant electrical potential (fixed electrical potential), instead of the clock signal (CLK), to the shift register 102-1 for a constant time period.

More specifically, the constant electrical potential (fixed electrical potential) instead of the clock signal is input into the shift register 102-1 for a constant time period by means of the clock signal control circuit 106, so that the timing signal that is to be used for inputting the digital video signal at less significant bits in the range from the first bit to the m-th bit into the latch (A) 102-2 is prevented from being input into the latch (A) 102-2. Accordingly, among the digital video signal n input from external source signal line driver circuit, only the digital video signal at more significant bits in the range from the (m+1)-th bit to the n-th bit can be written into the latch (A) 102-2.

Figure 18A:
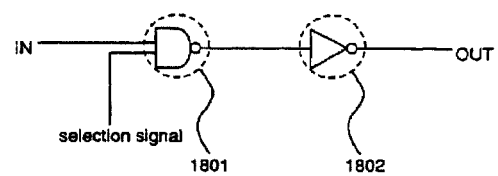
FIGS. 18A and 18B are circuit diagrams of a clock signal control circuit, a timing signal control circuit, and a start pulse signal control circuit.
Figure 18B:
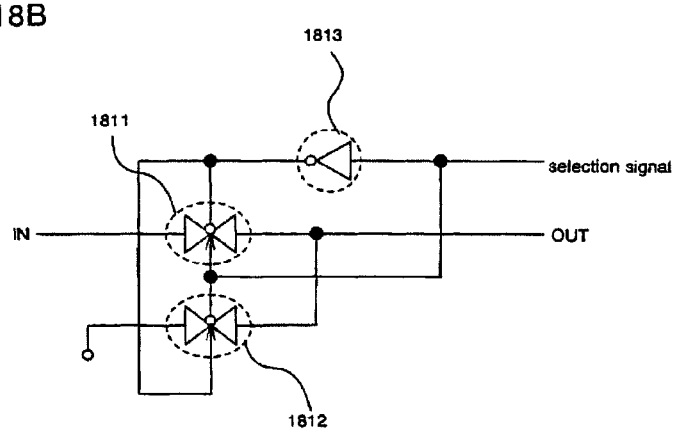

FIGS. 18A and 18B show detailed circuit diagrams of the clock signal control circuit 106 in accordance with the present embodiment.

The clock signal control circuit 106 of the present embodiment as shown in FIG. 18A includes a NAND 1801 and an inverter 1802. A selection signal is input through the illustrated wiring.

The clock signal to be input externally to the source signal line driver circuit is input into the NAND 1801 through an input terminal (IN). Simultaneously, the selection signal is also input into the NAND 1801. A signal output from the NAND 1801 is provided at an output terminal (OUT) after the polarity thereof is inverted by the inverter 1802 to be input into the shift register 102-1.

The selection signal determines whether the clock signal is to be input into the shift register 102-1, or the constant electrical potential (fixed electrical potential) is to be instead supplied thereto.

The clock signal control circuit 106 of the present embodiment as shown in FIG. 18B includes a first analog switch 1811, a second analog switch 1812, and an inverter 1813. A selection signal is input through the illustrated wiring.

Equivalent circuit diagrams of the first analog switch 1811 and the second analog switch 1812 are the same as that shown in FIG. 16. Each of the first analog switch 1811 and the second analog switch 1812 includes an n-channel type TFT and a p-channel type TFT. A signal to be input from an input terminal (IN) is sampled by means of a signal to be input from a first control input terminal (Vin) or a second control input terminal (Vinb), to be then output from an output terminal (OUT).

The selection signal is input into the first analog switch 1811 and the second analog switch 1812 through the first control input terminal (Vin). Simultaneously, the selection signal is also input into the first analog switch 1811 and the second analog switch 1812 through the second control input terminal (Vinb) after the polarity thereof is inverted. Further simultaneously, the clock signal to be supplied externally to the source signal line driver circuit is input into the first analog switch 1811 through the input terminal (IN). The second analog switch 1812 is supplied with the constant electrical potential (fixed electrical potential) through the input terminal (IN).

Signals respectively output from output terminals (OUT) of the first analog switch 1811 and the second analog switch 1812 are both output from an output terminal of the clock signal control circuit 106.

The selection signal determines whether the clock signal is to be input into the shift register 102-1, or the constant electrical potential (fixed electrical potential) is to be instead supplied thereto.

The structure of the clock signal control circuit is not limited to those shown in FIGS. 18A and 18B.

The present embodiment can be freely combined with Embodiments 1 through 3.

Embodiment 5

Figure 19:
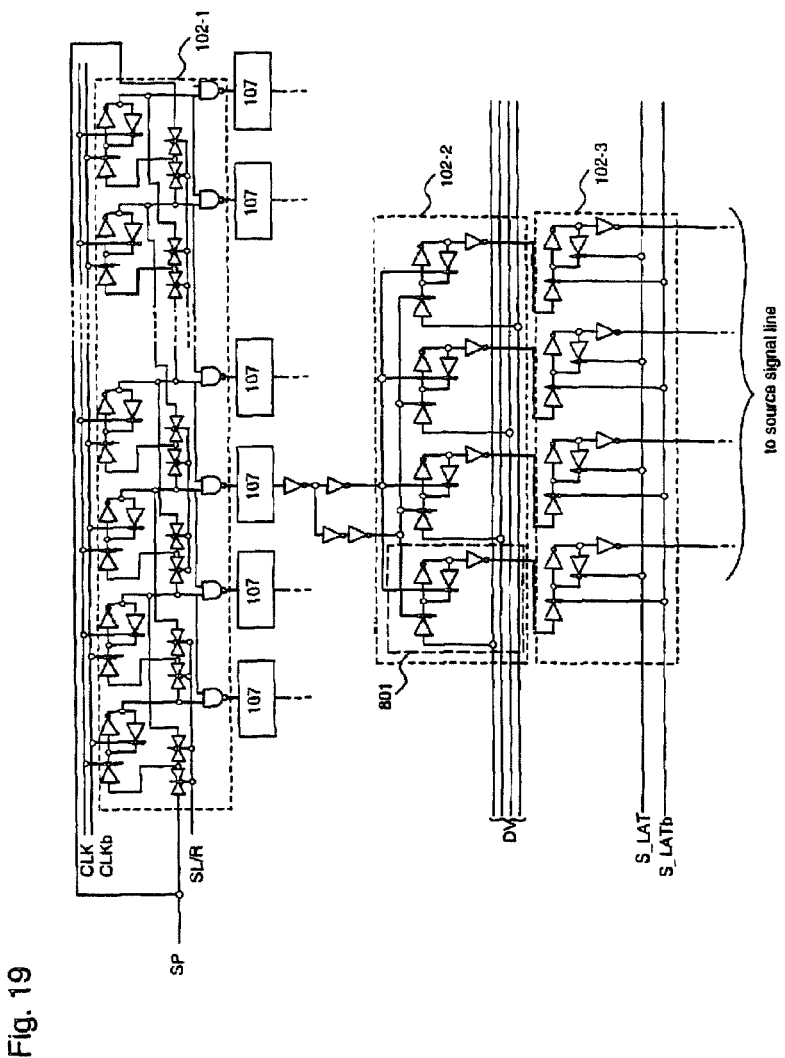
FIG. 19 is a circuit diagram of a source signal line driver circuit of a light emitting device in accordance with the present invention.

In the present embodiment, the structure of the source signal line driver circuit contained in the light emitting device as described in Embodiment 3 will be described in detail. FIG. 19 shows a circuit diagram of the source signal line driver circuit in the present embodiment. In FIG. 19, the same components as those shown in FIG. 1 are designated with the same reference numerals.

Reference numeral 102-1 denotes a shift register, to which a clock signal (CLK), a signal (CLKB) obtained by inverting the polarity of the clock signal, a start pulse signal (SP), a bi-direction shift signal (SL/R) are input through the illustrated wirings, respectively.

Reference numerals 102-2 and 102-3 denote a latch (A) and a latch (B), respectively. In the present embodiment, a combination of the latches (A) 102-2 and a combination of the latches (B) 102-3 correspond to four source signal lines. However, the number of source signal lines to which a combination of the latches (A) 102-2 and a combination of the latches (B) 102-3 correspond is not limited to the above number in the present embodiment. In addition, although a level shift for changing a width of a voltage amplitude of a signal is not provided in the present embodiment, such a level shift may be appropriately provided by a designer.

The digital video signal (DV) to be supplied externally to the source signal line driver circuit is input into the latch (A) 102-2 through the illustrated wirings. A latch signal S_LAT and a signal S_LATb obtained by inverting the polarity of the S_LAT are respectively input into the latch (B) 102-3 through the illustrated wirings.

The detailed structure of the latch (A) 102-2 is the same as that shown in FIG. 14. Accordingly, the description thereof is omitted here.

Reference numeral 107 denotes the timing signal control circuit, that can supply a constant electrical potential (fixed electrical potential), instead of the timing signal, to the latch (A) 102-2 for a constant time period.

More specifically, the constant electrical potential (fixed electrical potential) instead of the timing signal is input into the shift register 102-2 for a constant time period by means of the timing signal control circuit 107, so that the timing signal that is to be used for inputting the digital video signal at less significant bits in the range from the first bit to the m-th bit into the latch (A) 102-2 is prevented from being input into the latch (A) 102-2. Accordingly, only the digital video signal at more significant bits in the range from the (m+1)-th bit to the n-th bit can be written into the latch (A) 102-2.

A structure of the timing signal control circuit 107 in the present embodiment is the same as those shown in FIGS. 18A and 18B. Accordingly, the detailed description about the structure of the timing signal control circuit 107 should be found in Embodiment 4. It should be noted, however, that in the present embodiment, the timing signal from the shift register 102-1 is input into the input terminal (IN) in the circuits as shown in FIGS. 18A and 18B. A signal output from an output terminal (OUT) in the circuits as shown in FIGS. 18A and 18B is input into the latch (A) 102-2. The selection signal determines whether the timing signal is to be input into the latch (A) 102-2, or the constant electrical potential (fixed electrical potential) is to be instead supplied thereto.

The structure of the timing signal control circuit is not Limited to those shown in FIGS. 18A and 18B.

The present embodiment can be freely combined with Embodiments 1 through 3.

Embodiment 6

Figure 20:
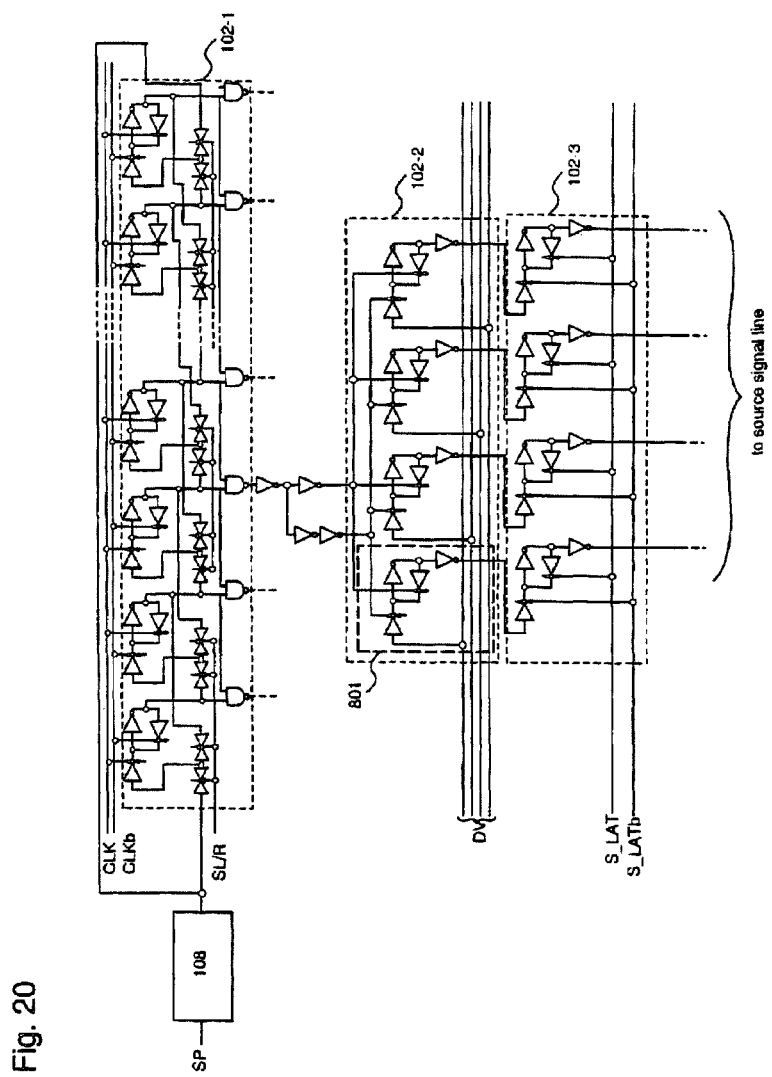
FIG. 20 is a circuit diagram of a source signal line driver circuit of a light emitting device in accordance with the present invention.

In the present embodiment, the structure of the source signal line driver circuit contained in the light emitting device as described in Embodiment 4 will be described in detail. FIG. 20 shows a circuit diagram of the source signal line driver circuit in the present embodiment. In FIG. 20, the same components as those shown in FIG. 1 are designated with the same reference numerals.

Reference numeral 102-1 denotes a shift register, to which a clock signal (CLK), a signal (CLKB) obtained by inverting the polarity of the clock signal, a start pulse signal (SP), a bi-direction shift signal (SL/R) are input through the illustrated wirings, respectively.

Reference numerals 102-2 and 102-3 denote a latch (A) and a latch (B), respectively. In the present embodiment, a combination of the latches (A) 102-2 and a combination of the latches (B) 102-3 correspond to four source signal lines. However, the number of source signal lines to which a combination of the latches (A) 102-2 and a combination of the latches (B) 102-3 correspond is not limited to the above number in the present embodiment. In addition, although a level shift for changing a width of a voltage amplitude of a signal is not provided in the present embodiment, such a level shift may be appropriately provided by a designer.

The digital video signal (DV) to be supplied externally to the source signal line driver circuit is input into the latch (A) 102-2 through the illustrated wirings. A latch signal S_LAT and a signal S_LATb obtained by inverting the polarity of the S_LAT are respectively input into the latch (B) 102-3 through the illustrated wirings.

The detailed structure of the latch (A) 102-2 is the same as that shown in FIG. 14. Accordingly, the description thereof is omitted here.

Reference numeral 108 denotes the start pulse signal control circuit, that can supply a constant electrical potential (fixed electrical potential), instead of the start pulse signal (SP), to the shift register 102-1 for a constant time period.

More specifically, the constant electrical potential (fixed electrical potential) instead of the start pulse signal is input into the shift register 102-2 for a constant time period by means of the start pulse signal control circuit 108, so that the timing signal that is to be used for inputting the digital video signal at less significant bits in the range from the first bit to the m-th bit into the latch (A) 102-2 is prevented from being input into the shift register 102-1. Accordingly, only the digital video signal at more significant bits in the range from the (m+1)-th bit to the n-th bit can be written into the latch (A) 102-2.

A structure of the start pulse signal control circuit 108 in the present embodiment is the same as those shown in FIGS. 18A and 18B. Accordingly, the detailed description about the structure of the start pulse signal control circuit 108 should be found in Embodiment 4. It should be noted, however, that in the present embodiment, the start pulse signal is input into the input terminal (IN) in the circuits as shown in FIGS. 18A and 18B. A signal output from an output terminal (OUT) in the circuits as shown in FIGS. 18A and 18B is input into the shift register 102-1. The selection signal determines whether the start pulse signal is to be input into the shift register 102-1, or the constant electrical potential (fixed electrical potential) is to be instead supplied thereto.

The structure of the start pulse signal control circuit is not limited to those shown in FIGS. 18A and 18B.

The present embodiment can be freely combined with Embodiments 1 through 3.

Embodiment 7

Figure 21:
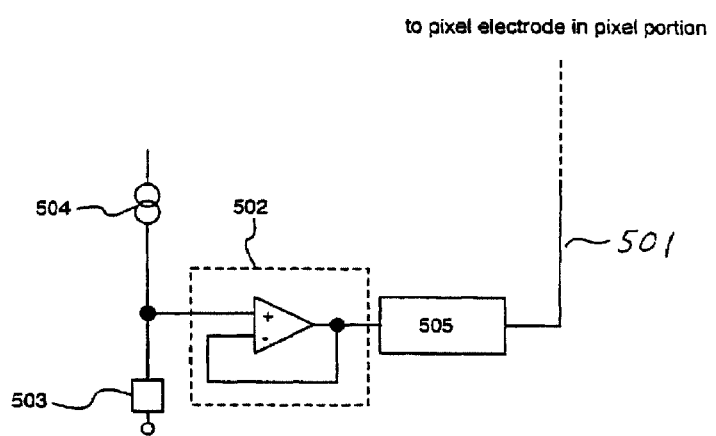
FIG. 21 is a diagram for illustrating connection of a monitoring light emitting element of a light emitting device in accordance with the present invention.

In the present embodiment, another example for the third structure in accordance with the present invention, which is different from that as described in Embodiment 5, will be described with reference to FIG. 21. In FIG. 21, the same component as shown in FIG. 5 are designated with the same reference numerals.

In FIG. 21, reference numeral 501 denotes a power source line, reference numeral 502 denotes a buffer amplifier, reference numeral 503 denotes a monitoring light emitting device, reference numeral 504 denotes a constant current source, and reference numeral 505 denotes an adding circuit. One of electrodes of the monitoring light emitting element 503 is connected to the constant current source 504, so that a constant current always flows through the monitoring light emitting element 503. When a temperature of an organic compound layer contained in the light emitting element changes, the magnitude of the current to flow through the monitoring light emitting element 503 does not change, but rather, an electrical potential of the electrode of the monitoring light emitting element 503 connected to the constant current source 504 changes.

On the other hand, the buffer amplifier 502 includes two input terminals and one output terminal. One of the two input terminals is a non-inverted input terminal (+), while the other is an inverted input terminal (−). An electrical potential at one of electrodes of the monitoring light emitting device 503 is supplied to the non-inverted input terminal of the buffer amplifier 502.

The buffer amplifier 502 is a circuit for preventing an electrical potential at a pixel electrode of the monitoring light emitting element 503 connected to the constant current source 504 from changing in accordance with a load such as a wiring capacitance of the power source line 501 or the like. Accordingly, the electrical potential provided to the non-inverted input terminal of the buffer amplifier 502 is output from an output terminal to be supplied to the power source line as the power source potential, without being changed in accordance with a load of a wiring capacitance of the power source line 501, adding circuit 505 or the like, to the adding circuit 505.

The electrical potential supplied to the adding circuit 505 from the output terminal of the buffer amplifier 502 is further supplied to the power source line 501 as the power source voltage, after a certain constant potential difference is added thereto or subtracted therefrom.

Figure 22:
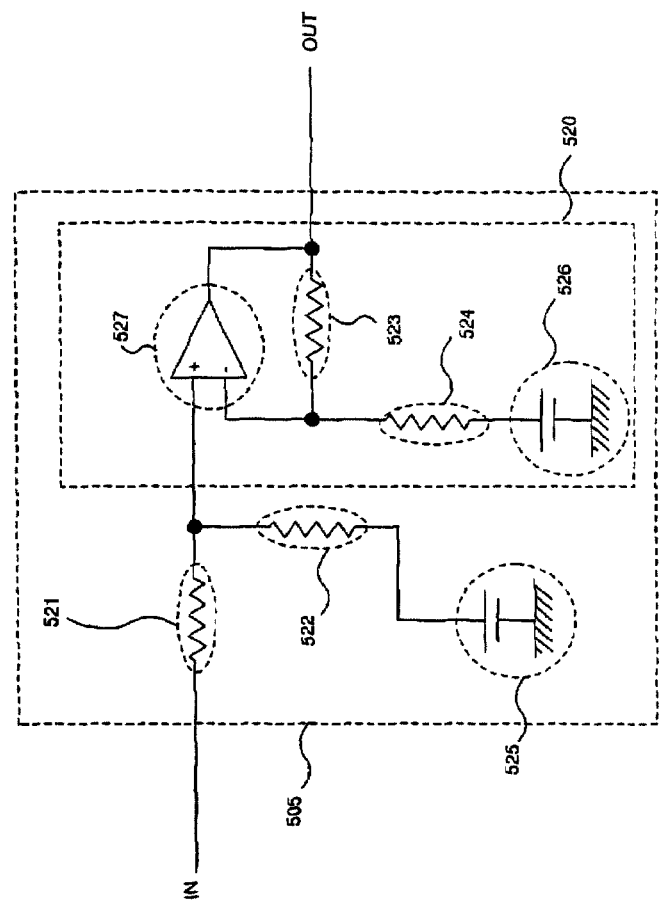
FIG. 22 is a circuit diagram of an adding circuit.

FIG. 22 shows the detailed circuit diagram of the adding circuit in the present embodiment. The adding circuit 505 includes a first resistor 521, a second resistor 522, a power source 525 for the adding circuit, and a non-inverting amplifier circuit 520. The non-inverting amplifier circuit 520 includes a third resistor 523, a fourth resistor 524, a power source 526 for the non-inverting amplifier circuit, and an amplifier 527.

One of the terminals of the first resistor 521 functions as an input terminal (IN) of the adding circuit. The other terminal of the first resistor 521 is connected to one of the terminals of the second resistor 522. The other terminal of the second resistor 522 is connected to the power source 525 for the adding circuit. An output obtainable between the first resistor 521 and the second resistor 522 is input into the non-inverted input terminal (+) of the amplifier 527 of the non-inverting amplifier circuit 520.

One of the terminals of the third resistor 523 is connected to an output terminal of the amplifier 527, while the other terminal of the third resistor 523 is connected to the inverted input terminal of the amplifier 527. An output obtainable between the third resistor 523 and the inverted input terminal of the amplifier 527 is input to one of the terminals of the fourth resistor 524. The other terminal of the fourth resistor 524 is connected to the power source 526 for the non-inverting amplifier circuit. An output obtainable between the third resistor 523 and the output terminal of the amplifier 527 is output from an output terminal (OUT) of the adding circuit 505.

In accordance with the above-described structure, even when a temperature of the monitoring light emitting element 503 or the organic compound layer of the light emitting element in the pixel portion changes due to a change in an environmental temperature, the power source potential is changed so as to allow a constant current to flow through the light emitting element. Thus, even when the environmental temperature of the light emitting device increases, power consumption of the light emitting device can be prevented from increasing, and furthermore, the brightness of the light emitting element can be maintained at a constant level. Moreover, by further providing the adding circuit 505, the electrical potential of the power source line 501 is not required to be at the same level as the electrical potential of the electrode connected to the constant current source 504 of the monitoring light emitting element 503. Thus, the magnitude of the current to flow through the buffer amplifier 502, the monitoring light emitting element 503, and the constant current source 504 can be suppressed, thereby resulting in the power consumption being suppressed.

The structure of the adding circuit 505 is not limited to that shown in FIG. 22.

The present embodiment can be freely combined with Embodiments 1 through 6.

Embodiment 8

In Embodiment 8, a method of manufacturing a pixel portion and TFTs (n-channel TFTs and p-channel TFTs) of a driver circuit formed in the periphery of the pixel portion, on the same substrate simultaneously is explained in detail.

First, as shown in FIG. 23A, a base film 401 made from an insulating film such as a silicon oxide film, a silicon nitride film, or a silicon oxynitride film is formed on a substrate 400 made from glass such as barium borosilicate glass or aluminum borosilicate glass, typically Corning Corp. #7059 glass or #1737 glass, or made from a quartz substrate. For example, a silicon oxynitride film made from $SiH_4$, $NH_3$, and $N_2O$ by plasma CVD is formed with a thickness of 10 to 200 nm (preferably from 50 to 100 nm), and a hydrogenated silicon oxynitride film with a thickness of 50 to 200 nm (preferably between 100 and 150 nm), made from $SiH_4$ and $N_2O$, is similarly formed and laminated. Note that the base film is shown as one layer in FIG. 23A. The base film 401 is shown as a two layer structure in Embodiment 8, but it may also be formed as a single layer of the above insulating films, and it may also be formed having a lamination structure in which two layers or more are laminated.

Semiconductor layers 402 to 405 are formed from a crystalline semiconductor film which is formed by a semiconductor film having an amorphous structure with a laser crystallization method or a known thermal crystallization method. The thickness of the semiconductor layers 402 to 405 is formed to a thickness of 25 to 80 nm (preferably between 30 and 60 nm). There are no limitations in the crystalline semiconductor film material, but it is preferable to form the film from silicon or silicon germanium (SiGe) alloy.

As for known crystallization methods, there is a thermal crystallization method using an electric furnace, a laser annealing crystallization method using laser light, a lamp annealing crystallization method using infrared light, and a crystallization method using a catalyst metal.

A laser such as a pulse emission type or continuous emission type excimer laser, a YAG laser, and a $YVO_4$ laser can be used in the laser crystallization method to manufacture a crystalline semiconductor film. A method of condensing laser light emitted from a laser emission device into a linear shape by an optical system and then irradiating the light to the semiconductor film may be used when these types of lasers are used. The crystallization conditions may be suitably selected by the operator, but when using the excimer laser, the pulse emission frequency is set to 300 Hz, and the laser energy density is set from 100 to 400 $mJ/cm^2$ (typically between 200 and 300 $mJ/cm^2$). Further, the second harmonic is utilized when using the YAG laser, the pulse emission frequency is set from 30 to 300 kHz, and the laser energy density may be set from 300 to 600 $mJ/cm^2$ (typically between 350 and 500 $mJ/cm^3$. The laser light collected into a linear shape with a width of 100 to 1000 μm, for example 400 μm, is then irradiated over the entire surface of the substrate. This is performed with an overlap ratio of 50 to 98% for the linear shape laser light.

Then, a gate insulating film 406 is formed covering the semiconductor layers 402 to 405. A gate insulating film 406 is formed by an insulating film containing silicon with a thickness of 40 to 150 nm by plasma CVD or sputtering. A 120 nm thick silicon oxynitride film is formed in Embodiment 8. The gate insulating film 406 is not limited to this type of silicon oxynitride film, of course, and other insulating films containing silicon may also be used, in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C. and by discharging at a high frequency (13.56 MHZ) electric power density of 0.5 to 0.8 W/cm². Good characteristics as a gate insulating film can be obtained by subsequently performing thermal annealing, at between 400 and 500° C., of the silicon oxide film thus manufactured.

A first conducting film 407 and a second conducting film 408 are then formed on the gate insulating film 406 in order to form gate electrodes. The first conducting film 407 is formed from Ta (tantalum) with a thickness of 50 to 100 nm, and the second conducting film 408 is formed from W (tungsten) having a thickness of 100 to 300 nm, in Embodiment 8.

The Ta film is formed by sputtering, and sputtering of a Ta target is performed in Ar. If appropriate amounts of Xe and Kr are added to Ar at the time of sputtering, the internal stress of the Ta film is relaxed, and film peeling can be prevented. The resistivity of an α phase Ta film is on the order of 20 μΩcm, and it can be used in the gate electrode, but the resistivity of a β phase Ta film is on the order of 180 μΩcm and it is unsuitable for the gate electrode. An α phase Ta film can easily be obtained if a tantalum nitride film, which possesses a crystal structure near that of α phase Ta, is formed with a thickness of 10 to 50 nm as a base for Ta in order to form α phase Ta.

The W film is formed by sputtering with a W target, which can also be formed by thermal CVD using tungsten hexafluoride ($WF_6$). Whichever is used, it is necessary to be able to make the film become low resistance in order to use it as the gate electrode, and it is preferable that the resistivity of the W film be made equal to or less than 20 μΩcm. The resistivity can be lowered by enlarging the crystal grains of the W film, but for cases in which there are many impurity elements such as oxygen in the W film, crystallization is inhibited, and the film becomes high resistance. A W target having a purity of 99.9999% or 99.99% is thus used in sputtering. In addition, by forming the W film while taking sufficient care that no impurities from the gas phase are introduced at the time of film formation, the resistivity of 9 to 20 μΩcm can be achieved.

Note that, although the first conducting film 407 is Ta and the second conducting film 408 is W in Embodiment 8, the conducting films are not limited to these, and both may also be formed from an element selected from the group consisting of Ta, W, Ti, Mo, Al, and Cu, or from an alloy material having one of these elements as its main constituent, or from a chemical compound of these elements. Further, a semiconductor film, typically a poly-crystalline silicon film into which an impurity element such as phosphorus is doped, may also be used. An example of preferable combinations other than that used in Embodiment 8 include: forming the first conducting film by tantalum nitride (TaN) and combining it with the second conducting film formed from W; forming the first conducting film by tantalum nitride (TaN) and combining it with the second conducting film formed from Al; and forming the first conducting film by tantalum nitride (TaN) and combining it with the second conducting film formed from Cu. (See FIG. 23B.)

Masks 409 to 412 are formed next from resist, and a first etching process is performed in order to form electrodes and wirings. An ICP (inductively coupled plasma) etching method is used in Embodiment 8. A gas mixture of $CF_4$ and $Cl_2$ is used as an etching gas, and a plasma is generated by applying a 500 W RF electric power (13.56 MHZ) to a coil shape electrode at a pressure of 1 Pa. A 100 W RF electric power (13.56 MHZ) is also applied to the substrate side (test piece stage), effectively applying a negative self-bias voltage. The W film and the Ta film are both etched on the same order when $CF_4$ and $Cl_2$ are combined.

Not shown in FIG. 23C, edge portions of the first conducting layer and the second conducting layer are made into a tapered shape in accordance with the effect of the bias voltage applied to the substrate side under the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. Further, not shown in FIG. 23C, regions of the gate insulating film 406 not covered by first shape conducting layers 414 to 417 are made thinner by 20 to 50 nm after etching.

The first shape conducting layers 414 to 417 (first conducting layers 414a to 417a and second conducting layers 414b to 417b) are thus formed from the first conducting layer and the second conducting layer in accordance with the first etching process.

A second etching process is performed next, as shown in FIG. 23D. The ICP etching method is similarly used, a mixture of $CF_4$, $Cl_2$, and $O_2$ is used as the etching gas, and a plasma is generated by supplying a 500 W RF electric power (13.56 MHZ) to a coil shape electrode at a pressure of 1 Pa. A 50 W RF (13.56 MHZ) electric power is applied to the substrate side (test stage), and a self-bias voltage which is lower in comparison to that of the first etching process is applied. The W film is etched anisotropically under these etching conditions, and Ta (the first conducting layers) is anisotropically etched at a slower etching speed, forming second shape conducting layers 419 to 422 (first conducting layers 419a to 422a and second conducting layers 419b to 422b). Further, although not shown in FIG. 23D, the gate insulating film 406 is additionally etched on the order of 20 to 50 nm, becoming thinner, in regions not covered by the second shape conducting layers 419 to 422.

The etching reaction of the W film and the Ta film in accordance with the mixed gas of $CF_4$ and $Cl_2$ can be estimated from the radicals generated, and from the ion types and vapor pressures of the reaction products. Comparing the vapor pressures of W and Ta fluorides and chlorides, the W fluoride compound $WF_6$ is extremely high, and the vapor pressures of $WCl_5$, $TaF_5$, and $TaCl_5$ are of similar order. Therefore the W film and the Ta film are both etched by the $CF_4$ and $Cl_2$ gas mixture. However, if a suitable quantity of $O_2$ is added to this gas mixture, $CF_4$ and $O_2$ react, forming CO and F, and a large amount of F radicals or F ions are generated. As a result, the etching speed of the W film having a high fluoride vapor pressure becomes fast. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. It therefore becomes possible to have a difference in etching speeds between the W film and the Ta film, and it becomes possible to make the etching speed of the W film larger than that of the Ta film.

Then, the masks 409a to 412a are removed, and a first doping process is performed as shown in FIG. 24A, adding an impurity element which imparts n-type conductivity. For example, doping may be performed at an acceleration voltage of 70 to 120 keV and with a dose amount of $1\times10^{13}$ atoms/cm$^2$. The doping process is performed using the second shape conducting layers 419 to 422 as masks against the impurity element, and so as to also add the impurity element in regions below the second conducting layers 419a to 422a. First impurity regions 425 to 428, which overlap with the second conducting layers 419a to 422a, and second impurity regions 429 to 432, which have a higher impurity concentration than the first impurity regions, are thus formed. Note that the impurity element which imparts n-type conductivity is added after removing the masks 409a to 412a in Embodiment 8, but the present invention is not limited to this. The impurity element which imparts n-type conductivity may also be added in the step of FIG. 24A, and then the masks 409a to 412a may be removed.

A mask 433 is next formed on the semiconductor layer 404 so as to cover the second conducting layers 421a and 421b. The mask 433 partially overlaps with the second impurity region 431, sandwiching the gate insulating film 406. A second doping process is then performed, and an impurity element which imparts n-type conductivity is added. Doping of the impurity element which imparts n-type conductivity is performed at conditions in which the dose amount is raised higher than that of the first doping process, and at a low acceleration voltage. (See FIG. 24B.) The doping can be carried out by ion doping or ion implantation. Ion doping is performed under conditions of a dose amount from $1\times10^{13}$ to $5\times10^{14}$ atoms/cm$^2$ and an acceleration voltage of 60 to 100 keV. A periodic table group 15 element, typically phosphorus (P) or arsenic (As) is used as the impurity element which imparts n-type conductivity, and phosphorus (P) is used here. The second shape conducting layers 419 to 422 become masks with respect to the impurity element which imparts n-type conductivity in this case, and source regions 434 to 437, drain regions 438 to 441, and Lov regions 442 to 445 are formed in a self-aligning manner. Further, Loff region 446 is formed in accordance with the mask 433. The impurity element which imparts n-type conductivity is added to the source regions 434 to 437, and to the drain regions 438 to 441 with a concentration in the range of $1\times10^{20}$ to $1\times10^{21}$ atoms/cm$^3$.

It is possible to freely set the length of the Loff region 446 by controlling the size of the mask 433 according to Embodiment 8.

Note that in the specification, the LDD region overlapping with a gate electrode through a gate insulating film is referred to as an Lov region, and the LDD region not overlapping with a gate electrode through a gate insulating film is referred to as an Loff region.

The impurity element which imparts n-type conductivity is added at a concentration of $1\times10^{17}$ to $1\times10^{19}$ atoms/cm$^3$ in the Loff region, and at a concentration of $1\times10^{16}$ to $1\times10^{18}$ atoms/cm$^3$ in the Lov region.

Note that, in FIG. 24B, either before or after doping of an impurity element which imparts n-type conductivity is performed under the above mentioned condition, doping of an impurity element which imparts an n-type conductivity may also be performed with an acceleration voltage of 70 to 120 keV in a state in which the mask 433 is formed on the semiconductor layer 404. The concentration of the impurity element which imparts an n-type conductivity in a portion 446 which becomes an Loff region of the switching TFT can be suppressed in accordance with the above process, and the concentration of the impurity element which imparts n-type conductivity in portions 442 and 443, which become Lov regions of the TFTs used in the driver circuit can be increased.

It is possible to lower the off current of the switching TFT by suppressing the concentration of the impurity element which imparts an n-type conductivity in the portion 446 which becomes the Loff region of the switching TFT. Further, hot carriers generated in accordance with a high electric field in the vicinity of the drain and a cause of a degradation phenomenon due to the hot carrier effect can be prevented by increasing the concentration of the n-type conductivity imparting impurity element in the portion 443 which becomes the Lov region of the n-channel TFT used in the driver circuit.

After removing the mask 453, source regions 447 and 448, drain regions 449 and 450, and Lov regions 451 and 452, having a conductivity type which is the inverse of the above one conductivity type, are then formed in the semiconductor layers 402 and 405 for forming the p-channel TFT, as shown in FIG. 24C. The second shape conducting layers 419 and 422 are used as a mask with respect to the impurity element, and the impurity regions are formed in a self-aligning manner. The semiconductor layers 402 and 403, which form n-channel TFTs, are covered over their entire surface areas by a resist masks 453 at this point. Phosphorus is added in differing concentration to the source regions 447 and 448, the drain regions 449 and 450, and the Lov regions 451 and 452, and ion doping is performed here using diborane (B$_2$H$_6$), so that impurity is added to each of the regions with a concentration of $2\times10^{20}$ to $2\times10^{21}$ atoms/cm$^3$.

Impurity regions (source regions, drain regions, Lov regions, and Loff regions) are formed in the respective semiconductor layers 402 to 405 by the above processes. The second conducting layers 419 to 422 overlapping the semiconductor layers function as gate electrodes.

A process of activating the impurity elements added to the respective semiconductor layers is then performed, with the aim of controlling the conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 500° C. in Embodiment 8. However, for cases in which the wiring material used in the conducting layers 419 to 422 is weak with respect to heat, it is preferable to perform activation after forming an interlayer insulating film (having silicon as its main constituent) in order to protect the wirings and the like.

In addition, heat treatment is performed for 1 to 12 hours at 300 to 450° C. in an atmosphere containing between 3 and 100% hydrogen, performing hydrogenation of the semiconductor layers. This process is one of terminating dangling bonds in the semiconductor layers by hydrogen which is thermally excited. Plasma hydrogenation (using hydrogen excited by a plasma) may also be performed as another means of hydrogenation.

A first interlayer insulating film 455 is formed next from a silicon oxynitride film having a thickness of 100 to 200 nm. (FIG. 25A) A second interlayer insulating film 458 made from an organic insulating material is then formed on the first interlayer insulating film 455.

Contact holes are then formed in the gate insulating film 406, the first interlayer insulating film 455 and the second interlayer insulating film 458, and source wirings 459 to 462 are formed to contact the source regions 447, 435, 436, and 448 through the contact holes. In the same way, drain wirings 463 to 465 are further formed to contact the drain regions 449, 439, 440 and 450. (FIG. 25B)

Note that it is preferable to form the contact holes by dry etching using $CF_4$ and $O_2$ when the gate insulating film 406, the first interlayer insulating film 455, and the second interlayer insulating film 458 are $SiO_2$ films or SiON films. Further, for cases in which the gate insulating film 406, the first interlayer insulating film 455, and the second interlayer insulating film 458 are organic resin films, it is preferable to form the contact holes by dry etching using $CHF_3$ or by BHF (buffered hydrogen fluoride, $HF+NH_4F$). In addition, if the gate insulating film 406, the first interlayer insulating film 455 and the second interlayer insulating film 458 are formed by different materials, it is preferable to change the method of etching and the etchant or etching gas type for each film. The contact holes may also be formed by using the same etching method and the same etchant or etching gas.

A third interlayer insulating film 467 is formed next from an organic resin. Organic resins such as polyimide, polyamide, acrylic, and BCB (benzocyclobutene) can be used. In particular, it is preferable to use acrylic, which has superior levelness, because the third interlayer insulating film 467 is formed with a strong implication of leveling. An acrylic film is formed in Embodiment 8 at a film thickness at which steps formed by the TFTs can be sufficiently leveled. The film thickness is preferably from 1 to 5 μm (more preferably between 2 and 4 μm).

A contact hole for reaching the drain wiring 465 is formed next in the third interlayer insulating film 467, and a pixel electrode 468 is formed. An indium tin oxide (ITO) film is formed with a thickness of 110 nm in Embodiment 8, and patterning is then performed, thereby forming the pixel electrode 468. Further, a transparent conducting film in which between 2 and 20% zinc oxide (ZnO) is mixed with indium oxide may also be used. The pixel electrode 468 becomes an anode of a light emitting layer. (See FIG. 25C.)

Figure 26A:
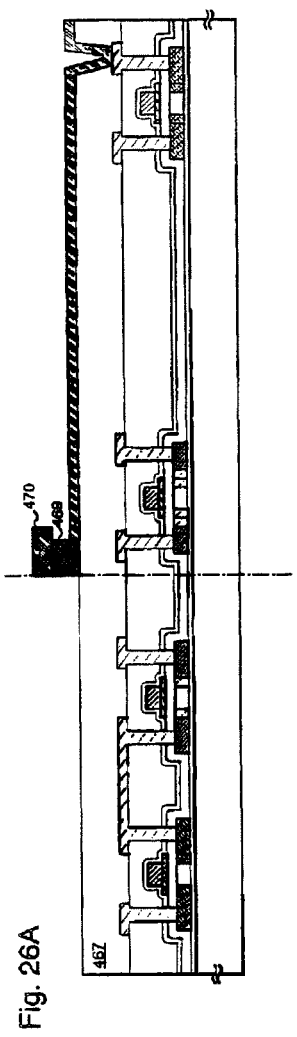
FIGS. 26A and 26B are cross-sectional views for illustrating various steps of a fabricating method of a light emitting device.

A first bank 469 and a second bank 470 are formed next from a resin material. The first bank 469 and the second bank 470 are formed in order to separate an organic compound layers and cathodes, which are formed later, of adjacent pixels. It is therefore preferable that the second bank 470 stick out farther horizontally than the first bank 469. Note that it is preferable that the combined thickness of the first bank 469 and the second bank 470 be made on the order of 1 to 2 μm, but there are no limitations on this thickness provided that the organic compound layers and the cathodes formed later of adjacent pixels can be separated. Further, it is necessary to form the first bank 469 and the second bank 470 by an insulating film, and it is therefore possible to use materials such as an oxide or a resin, for example. The first bank 469 and the second bank 470 may both be formed by the same material, and they may also be formed by different materials. The first bank 469 and the second bank 470 are formed in stripe shapes between pixels. The first bank 469 and the second bank 470 may be formed on and along the source wirings (source signal lines), and may be formed on and along the gate wirings (gate signal lines). Note that the first bank 469 and the second bank 470 may also be formed by a material in which a pigment is mixed into a resin. (See FIG. 26A.)

An organic compound layer 471 and a cathode (MgAg electrode) 472 are formed next in succession without exposure to the atmosphere using vacuum evaporation. Note that the film thickness of the organic compound layer 471 may be from 80 to 200 nm (typically between 100 and 120 nm), and that the film thickness of the cathode 472 may be from 180 to 300 nm (typically between 200 and 250 nm). Note also that, although only one pixel is shown in Embodiment 8, an organic compound layer which emits red color light, an organic compound layer which emits green color light, and an organic compound layer which emits blue color light are formed at the same time at this point. Note that materials to form an organic compound layer and a cathode is partially laminated on the bank 470, however, in this specification, the materials are not included in the organic compound layer 471 and the cathode 472.

The organic compound layer 471 and the cathode 472 are formed in order for a pixel corresponding to the red color, a pixel corresponding to the green color, and a pixel corresponding to the blue color. However, the organic compound layer 471 lacks resistance with respect to solutions, and therefore each color must be formed separately without using a photolithography technique. It is preferable to use a metal mask and cover the pixels other than the desired pixel, and selectively form the organic compound layer 471 and the cathode 472 in only the required portions.

Namely, first a mask is set so as to cover all of the pixels except for those corresponding to the red color, and red color light-emitting organic compound layers are selectively formed using the mask. Next, a mask is set so as to cover all of the pixels except for those corresponding to the green color, and green color light-emitting organic compound layers are selectively formed using the mask. Finally, a mask is set so as to cover all of the pixels except for those corresponding to the blue color, and blue color light-emitting organic compound layers are selectively formed using the mask. Note that, although the use of all different masks is described here, the same mask may also be reused. Further, it is preferable to perform processing until an organic compound layer and a cathode are formed on all of pixels without releasing the vacuum.

Note that the organic compound layer 471 has a single layer structure composed of only a light-emitting layer is shown in Embodiment 8, but a structure having layers such as a hole transporting layer, a hole injecting layer, an electron transporting layer, and an electron injecting layer in addition to the light-emitting layer may also be used for the organic compound layer. Various examples of these types of combinations have already been reported, and all such structures may be used. A known material can be used as the organic compound layer 471. Considering the driver voltage of a light emitting element, it is preferable to use an organic material as the known material.

The cathode 472 is formed next. An example of using an MgAg electrode as the cathode of an light emitting element is shown in Embodiment 8, but it is also possible to use other known materials.

Figure 26B:
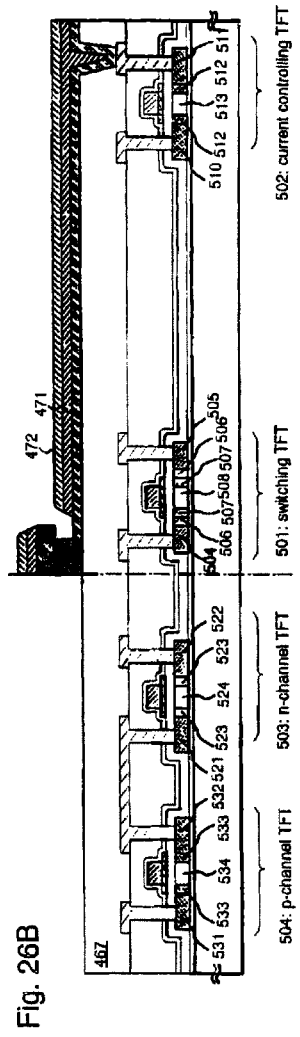

The active matrix substrate having the structure shown in FIG. 26B is thus completed. Note that, after forming the first bank 469 and the second bank 470, it is effective to perform processing in succession without exposure to the atmosphere up through to the formation of the cathode 472 by using a multi-chamber method (or an in-line method) thin film formation apparatus.

In Embodiment 8, a source region 504, a drain region 505, an Loff region 506, an Lov region 507, and a channel forming region 508 are contained in a semiconductor layer of a switching TFT 501. The Loff region 506 is formed so as not to overlap with the gate electrode 421 through the gate insulating film 406. Further, the Lov region 507 is formed so as to overlap with the gate electrode 421 through the gate insulating film 406. This type of structure is extremely effective in reducing the off current.

Further, a single gate structure is used as the switching TFT 501 in Embodiment 8, but the present invention may also have a double gate structure or another type of multi-gate structure for the switching TFT. Two TFTs are substantially connected in series by using the double gate structure, giving the advantage of additionally reducing the off current.

Further, the switching TFT 501 is an n-channel TFT in Embodiment 8, but a p-channel TFT may also be used.

A semiconductor layer of a current controlling TFT 502 contains a source region 510, a drain region 511, an Lov region 512, and a channel forming region 513. The Lov region 512 is formed so as to overlap with the gate electrode 422 through the gate insulating film 406. Note that the current controlling TFT 502 does not have the Loff region in Embodiment 8, but a structure having the Loff region may also be used.

Further, the current controlling TFT 502 is a p-channel TFT in Embodiment 8, but it may also be an n-channel TFT.

Note that the active matrix substrate of Embodiment 8 shows an extremely high reliability, and its operational characteristics are also increased, by arranging optimally structured TFT in not only the pixel portion, but also in the driver circuit portion.

First, a TFT having a structure in which hot carrier injection is reduced so as not to have a very large drop in operational speed is used as an n-channel TFT 503 of a CMOS circuit forming the driver circuit portion. Note that circuits such as a shift register, a buffer, a level shifter, and a sampling circuit (sample and hold circuits) are included as the driver circuits here. Signal conversion circuits such as a D/A converter can also be included in the case of performing digital drive.

A semiconductor layer of the n-channel TFT 503 of the CMOS circuit in Embodiment 8 contains a source region 521, a drain region 522, an Lov region 523, and a channel forming region 524.

Further, a semiconductor layer of a p-channel TFT 504 of the CMOS circuit contains a source region 531, a drain region 532, an Lov region 533, and a channel forming region 534.

Note that, in practice, it is preferable to perform packaging (sealing) by a protecting film having high airtight characteristics and little outgassing (such as a laminate film or an ultraviolet hardened resin film) or by a transparent sealing material after completing up through to the processes of FIG. 26B so as to have no exposure to the atmosphere. Further, if an inert gas is placed in the inside of the sealing material, and a drying agent (barium oxide, for example) is arranged inside of the sealing material, then the reliability of the light emitting element is increased.

Further, a connector (flexible printed circuit, FPC) is attached in order to connect the elements formed on the substrate, with terminals extended from the circuits, to external signal terminals after increasing the airtight characteristics in accordance with the packaging process or the like. A manufactured product is thus completed. This type of deliverable state is referred to as a light emitting device throughout this specification.

The widths of the gate electrodes in the direction of the channel length (referred to hereinafter as a width of the gate electrode) differ as stated above in accordance with manufacturing processes of the present invention. Therefore, it is possible to make the ion implantation within the semiconductor layers arranged under the first gate electrode less than the ion concentration within the semiconductor layers not arranged under the first gate electrode by utilizing the difference in ion penetration depth, due to the difference of gate electrode thickness, when performing ion injection using the gate electrodes as masks.

Further, in order to form the Loff regions using a mask, only the width of Lov region needs to be controlled by etching. It becomes easy to control positions of the Lov regions and the Loff regions.

Note that although an example in which light emitted from the organic compound layer is directed toward the substrate side is explained in Embodiment 8, the present invention is not limited to this, and a structure in which light emitted from the organic compound layer is directed above the substrate may also be used. In this case, the cathode of the light emitting element becomes the pixel electrode, and it is preferable that the current controlling TFT be an n-channel TFT.

Note that although the case in which a pixel has a switching TFT and a current controlling TFT is explained in Embodiment 8, the present invention is not limited to this. Even when a pixel has three TFTs or more, it is possible to apply the present embodiment.

The method of manufacturing a light emitting device according to the present invention is not limited to the manufacturing method described in Embodiment 8 and other manufacturing methods can be utilized.

Note that it is possible to freely combine Embodiment 8 with any of Embodiments 1 to 7.

Embodiment 9

A light emitting device manufactured by the present invention has superior visibility in bright locations in comparison to a liquid crystal display device because it is a self-emission type device, and moreover viewing angle is wide. Accordingly, it can be used as a display portion for various electronic apparatuses. For example, it is appropriate to use the light emitting display device of the present invention as a display portion of a display device incorporating the light emitting device in its casing having a diagonal equal to 30 inches or greater (typically equal to 40 inches or greater) for appreciation of TV broadcasts by large screen. The light emitting device of the present invention can be used as a display portion for various electronic apparatuses.

The following can be given as examples of such electronic apparatuses: a video camera; a digital camera; a goggle type display (head mounted display); a car navigation system; an audio reproducing device (such as a car audio system, an audio compo system); a notebook personal computer, a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the light emitting device is employed. Examples of those electronic apparatuses are shown in FIGS. 27 and 28.

Figure 27A:
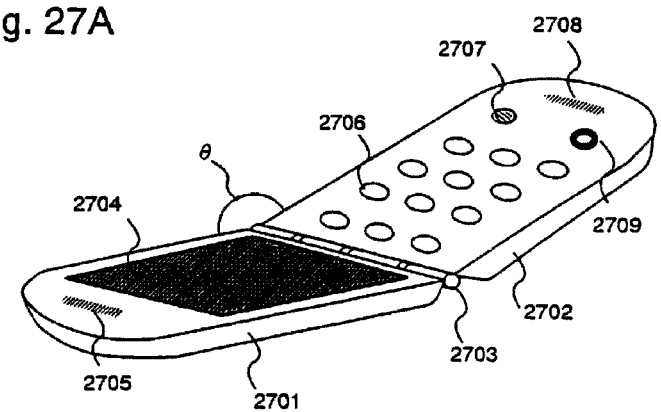
FIGS. 27A and 27B are diagram for illustrating electronic apparatuses each employing a light emitting device in accordance with the present invention.

FIG. 27A illustrates a portable information terminal which includes a display panel 2701 and an operation panel 2702. The display panel 2701 is connected with the operation panel 2702 at a connection portion 2703. In the connection portion 2703, an angle θ between a surface provided with the display portion 2704 of the display panel 2701 and a surface provided with an operation key 2706 of the operation panel 2702 can be arbitrary varied.

The display panel 2701 includes the display portion 2704. Further, the portable information terminal shown in FIG. 27A has a function as a telephone, and the display panel 2701 includes an audio output portion 2705, so that voice is outputted from the audio output portion 2705. The light emitting device of the present invention can be utilized for the display portion 2704.

The operation panel 2702 includes an operation key 2706, a power switch 2707, an audio input portion 2708, and a CCD receiving portion 2709. Note that although the operation key 2706 and the power switch 2707 are provided separately in FIG. 27A, the power switch 2707 may be included in the operation key 2706.

In the audio input portion 2707, voice is inputted. The image inputted at the CCD receiving portion 2709 is received in the portable information terminal as an electronic data.

Note that although the display panel 2701 includes the audio output portion 2705 and the operation panel includes the audio input portion 2708 in FIG. 27A. The present embodiment is not limited to this. Namely, the display panel 2701 includes the audio input portion 2708, and the operation panel includes the audio output portion 2705. Further, the audio output portion 2705 and the audio input portion 2708 may be provided in the display panel 2701, and the audio output portion 2705 and the audio input portion 2708 may be provided in the operation panel 2702.

Note that although the portable information terminal includes no antenna in FIG. 27A, an antenna may be provided, if necessary.

Figure 27B:
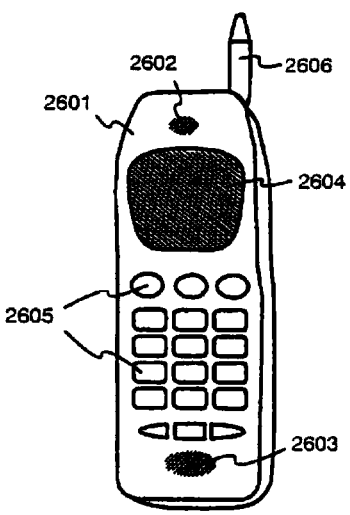

FIG. 27B illustrates a portable telephone, which includes a main body 2601, an audio output portion 2602, an audio input portion 2603, a display portion 2604, operation switches 2605, and an antenna 2606. The light emitting device in accordance with the present invention can be used as the display portion 2604. The display portion 2604 can reduce power consumption of the portable telephone by displaying white-colored characters on a black-colored background.

The light emitting device of the present invention is very effective for the portable type electronic apparatus since power consumption can be reduced.

Figure 28A:
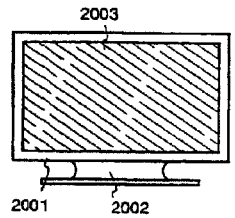
FIGS. 28A through 28F are diagram for illustrating electronic apparatuses each employing a light emitting device in accordance with the present invention.

FIG. 28A illustrates a display device having a light emitting device which includes a frame 2001, a support table 2002, a display portion 2003, or the like. The light emitting device of the present invention is applicable to the display portion 2003. The light emitting device is of the self-emission type and therefore requires no back light. Thus, the display portion thereof can have a thickness thinner than that of the liquid crystal display device.

Figure 28B:
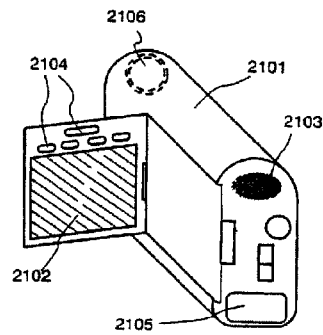

FIG. 28B illustrates a video camera which includes a main body 2101, a display portion 2102, an audio input portion 2103, operation switches 2104, a battery 2105, an image receiving portion 2106, or the like. The light emitting device in accordance with the present invention can be used as the display portion 2102.

Figure 28C:
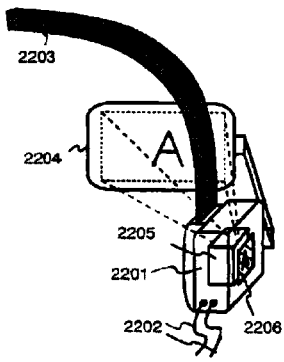

FIG. 28C illustrates one portion (the right-half piece) of a head-mounted type electronic apparatus which includes a main body 2201, signal cables 2202, a head mount band 2203, a screen portion 2204, an optical system 2205, a display portion 2206, or the like. The light emitting device of the present invention is applicable to the display portion 2206.

Figure 28D:
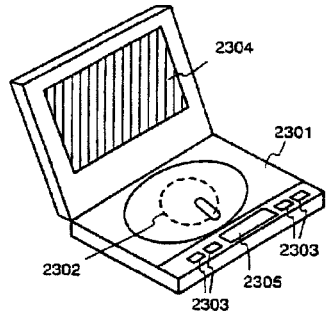

FIG. 28D illustrates an image reproduction apparatus provided with a recording medium (more specifically, a DVD reproduction apparatus), which includes a main body 2301, a recording medium (a DVD or the like) 2302, operation switches 2303, a display portion (a) 2304, another display portion (b) 2305, or the like. The display portion 2304 (a) is used mainly for displaying image information, while the display portion 2305 (b) is used mainly for displaying character information. The light emitting device in accordance with the present invention can be used as these display portions 2304 (a) and 2305(b). The image reproduction apparatus provided with a recording medium further includes a domestic game equipment or the like.

Figure 28E:
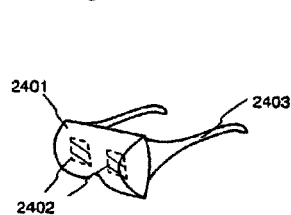

FIG. 28E illustrates a goggle type display (head-mounted display) which includes a main body 2401, a display portion 2402, and an arm portion 2403. The light emitting device in accordance with the present invention can be used to the display portion 2402.

Figure 28F:
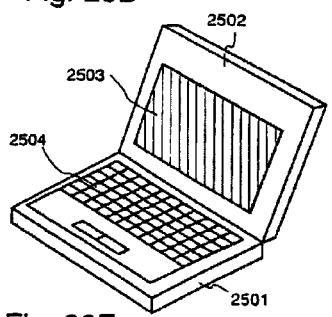

FIG. 28F illustrates a personal computer which includes a main body 2501, a frame 2502, a display portion 2503, a key board 2504, or the like. The light emitting device in accordance with the present invention can be used as the display portion 2503. Note that if emission luminance of an organic material becomes higher in the future, light including outputted image information is enlarged to be projected by means of lenses or the like, thereby applying to a front-type or a rear-type projector.

The aforementioned electronic apparatuses are more likely to be used for display information distributed through a telecommunication path such as Internet, a CATV (cable television system), and in particular likely to display moving picture information. The light emitting device is suitable for displaying moving pictures since the organic material can exhibit high response speed.

Since a light emitting portion of the light emitting device consumes power, it is desirable to display information in such a manner that the light emitting portion therein becomes as small as possible. Accordingly, when the light emitting device is applied to a display portion which mainly displays character information, e.g. a display portion of a portable information terminal, and more particular, a portable telephone or a car audio reproducing equipment, it is desirable to drive the light emitting display device so that the character information is formed by a light-emitting portion while a non-emission portion corresponds to the background.

As set forth above, the present invention can be applied variously to a wide range of electronic apparatuses in all fields. Note that it is possible to freely combine Embodiment 9 with any of Embodiments 1 to 8.

Embodiment 10

In this embodiment, a further specific structure of a third structure of the present invention and a change in brightness due to a temperature will be explained with measured values.

Figure 29A:
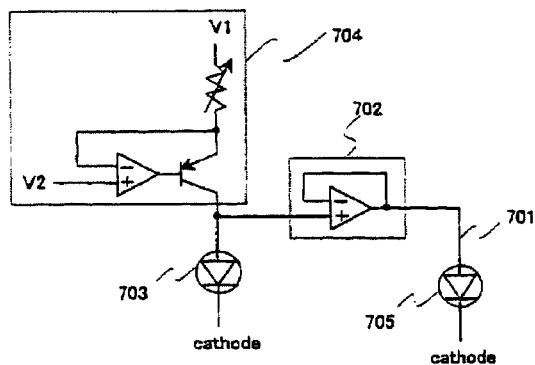
FIGS. 29A and 29B show a connection of a light emitting element for a monitor of the light emitting device of the present invention, and a characteristic in measurement values of brightness due to temperatures of the light emitting element, respectively.

FIG. 29A shows a connection state of a light emitting element for a monitor, which is included in a light emitting device of this embodiment. Reference numerals 701, 702, 703, 704 and 705 represent a power source line, a buffer amplifier, a monitoring light emitting element, a constant current source, and one of light emitting elements in a pixel portion, respectively.

FIG. 29A shows a case when a current controlling TFT (not shown) is "ON" state, and the current controlling TFT directly connects a pixel electrode of the light emitting element 705 in the pixel portion and the power source line 701.

Also, in FIG. 29A, although an anode of the light emitting element 705 in the pixel portion is used as a pixel electrode, this embodiment is not limited to such a structure. A cathode may be used as a pixel electrode.

The constant current source 704 of this embodiment has an amplifier, a variable resistor and a bipolar transistor. References V1 and V2 represent a predetermined voltage to be applied, a relationship (a voltage applied to an anode<V2<V1) is satisfied. By the way, the relationship among the voltage applied to the anode, V2, and V1 is changed depending on whether an anode is used as a pixel electrode or a cathode is used as pixel electrode. In order to flow a forward bias current into a light emitting element, the relationship among the voltage applied to the anode, V2, and V1 is appropriately set. Also, the constant current source 704 is not limited to the structure as shown in FIG. 29A, a well-known constant current source can be used.

An output terminal of the constant current source 704 is connected with a pixel electrode of the monitoring light emitting element 703. By the way, when an anode of the light emitting element 705 in the pixel portion is used as a pixel electrode, an anode of the monitoring light emitting element 703 is also used as a pixel electrode. To the contrary, when a cathode of the light emitting element 705 in the pixel portion is used as a pixel electrode, a cathode of the monitoring light emitting element 703 is also used as a pixel electrode. In FIG. 29A, the anode of the monitoring light emitting element 703 is used as a pixel electrode.

When the output terminal of the constant current source 704 is connected with the pixel electrode of the monitoring light emitting element 703 and thus a current flows into the monitoring light emitting element 703, its value is always kept constant. And then, when a temperature of a organic compound layer included in the light emitting element is changed, although an amount of a current flowing into the monitoring light emitting element 703 is not changed, a potential of the pixel electrode of the monitoring light emitting element 703, which is connected with the constant current source 704, is changed.

On the other hand, the buffer amplifier 702 has two input terminals and one output terminal, one of the two input terminals is a non-inverted input terminal (+), and the other is an inverted input terminal (−). A potential of the pixel electrode of the monitoring light emitting element 703 is provided with the non-inverted input terminal of the buffer amplifier 702.

The buffer amplifier 702 is a circuit for suppressing a change in the potential of the pixel electrode of the monitoring light emitting element 703, which is connected with the constant current source 704, due to a load such as a wiring capacitance of the power source line 701 or the like. Thus, the potential provided with the non-inverted input terminal of the buffer amplifier 702 is output from the output terminal without the change due to a load such as a wiring capacitance of the power source line 701 or the like, and provided with the pixel electrode of the light emitting element 705 in the pixel portion. As a result, a current flowing into the monitoring light emitting element 703 is equal to a current flowing into the light emitting element 705 in the pixel portion.

Then, even when a temperature of an organic compound layer of the monitoring light emitting element 703 or the light emitting element 705 in the pixel portion is changed depending on a change in an ambiance temperature, a constant current flows into each light emitting element. Thus, even when the ambiance temperature of the light emitting device rises, an increase in power consumption of the light emitting device can be suppressed.

Figure 29B:
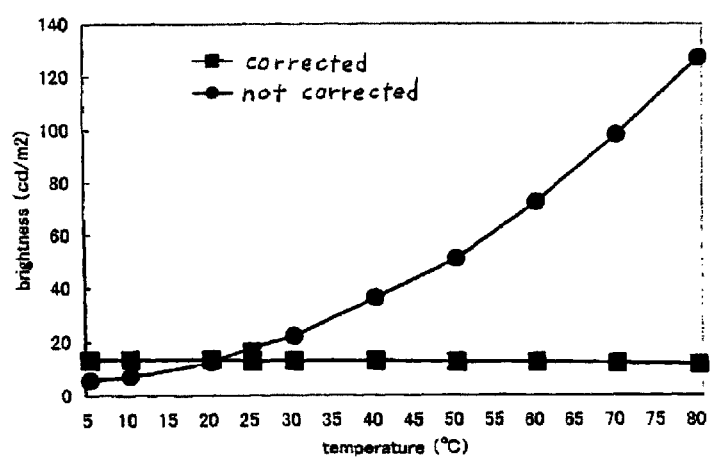

FIG. 29B shows a change in measurement values of brightness due to a temperature, of the light emitting element 705 in the pixel portion of the light emitting device having the structure as shown in FIG. 29A. By the way, a graph (corrected) relates to the measurement values in the light emitting device of the present invention, and a graph (not corrected) relates to the measurement values in the light emitting device without the third structure of the present invention.

As can be cleared from FIG. 29A, in the graph (not corrected), the brightness is increased depending on the rise of the temperature. However, in the graph (corrected), even when the temperature rises, the brightness is almost kept constant. Since a current and a brightness are in a proportional relation, in the light emitting device of the present invention, even when the temperature rises, a current can be kept constant, and the increase in the power consumption can be suppressed.

Also, in a light emitting element, a decrease in brightness is caused by deterioration of an organic light emitting layer. Here, even if the deterioration is caused in the same level, a decrease amount in brightness in the case where a current flowing between a cathode and an anode is kept constant is smaller than that in the case where a voltage applied between the cathode and the anode is kept constant. Thus, since a current flowing into the light emitting element can be kept constant in the light emitting device of the present invention, a decrease in brightness, due to deterioration can be suppressed.

This embodiment can be arbitrarily combined with the structures of Embodiments 1 to 9 with respect to the operation.

As described in the above, in accordance with the first structure of the present invention, the magnitude of a current to flow through the light emitting element can be suppressed to some degree, thereby resulting in a reduced power consumption of the light emitting device. In accordance with the second structure of the present invention, the number of bits of the digital video signal to be input into the pixels is reduced, and therefore, the required number of writing the digital video signal by the source signal line driver circuit and a gate signal line driver circuit can be reduced. Thus, power consumption of the source signal line driver circuit and the gate signal line driver circuit can be reduced, thereby resulting in a reduced power consumption of the light emitting device. In accordance with the third structure of the present invention, the magnitude of a current to flow through a light emitting element of a pixel is maintained at a constant level, even when a temperature of the organic compound layer changes. Thus, power consumption of the light emitting device can be prevented from increasing even when an environmental temperature of the light emitting device increases, which in turn can maintain the brightness at a constant level.

In accordance with the first, second, and third structures of the present invention as described in the above, it is possible to suppress the power consumption of a light emitting device and an electronic apparatus which employs the light emitting device. It should be noted that only either one of the first through third structures is required to be included in the present invention, although two or all of the first through third structures may be included.

What is claimed is:

1. A display device comprising:
   a first transistor and a second transistor, each including a semiconductor region over a substrate, a gate insulating film over the semiconductor region, and a gate electrode over the gate insulating film;
   a first interlayer insulating film over the first transistor and the second transistor;
   a second interlayer insulating film over the first interlayer insulating film;
   a pixel electrode over the second interlayer insulating film, wherein the pixel electrode is electrically connected with the semiconductor region of the second transistor;
   a first resin partly in contact with a top surface of the pixel electrode;
   a second resin over the first resin; and
   a light emitting layer including an organic compound over the pixel electrode and the second resin, wherein the light emitting layer has a region overlapping the semiconductor region of the first transistor and the semiconductor region of the second transistor.

2. The display device according to claim 1, wherein the first transistor is a switching transistor and the second transistor is a current-controlling transistor.

3. The display device according to claim 2, further comprising a third transistor whose source or drain is electrically connected to a source or drain of the switching transistor.

4. The display device according to claim 1, wherein each of the first resin and the second resin is a bank.

5. The display device according to claim 1, wherein the first resin and the second resin is formed of a same material.

6. The display device according to claim 1, wherein the first resin and the second resin is formed of different materials.

7. The display device according to claim 1, wherein the second resin is wider than the first resin.

8. The display device according to claim 1, wherein the light emitting layer over the second resin is spaced apart from the light emitting layer over the pixel electrode.

9. The display device according to claim 1, wherein the display device is incorporated in one selected from the group consisting of a telephone, a video camera, a digital camera, a goggle type display, an image reproduction apparatus, and a personal computer.

10. A display device comprising:
a silicon oxide film over and in contact with a substrate;
a first transistor and a second transistor, each including a semiconductor region over and in contact with the silicon oxide film, a gate insulating film over the semiconductor region, and a gate electrode over the gate insulating film;
a first interlayer insulating film over the first transistor and the second transistor;
a second interlayer insulating film over the first interlayer insulating film;
a pixel electrode over the second interlayer insulating film, wherein the pixel electrode is electrically connected with the semiconductor region of the second transistor;
a first resin partly in contact with a top surface of the pixel electrode;
a second resin over the first resin; and
a light emitting layer including an organic compound over the pixel electrode and the second resin,
wherein the light emitting layer has a region overlapping the semiconductor region of the first transistor and the semiconductor region of the second transistor.

11. The display device according to claim 10, wherein the first transistor is a switching transistor and the second transistor is a current-controlling transistor.

12. The display device according to claim 11, further comprising a third transistor whose source or drain is electrically connected to a source or drain of the switching transistor.

13. The display device according to claim 10, wherein each of the first resin and the second resin is a bank.

14. The display device according to claim 10, wherein the first resin and the second resin is formed of a same material.

15. The display device according to claim 10, wherein the first resin and the second resin is formed of different materials.

16. The display device according to claim 10, wherein the second resin is wider than the first resin.

17. The display device according to claim 10, wherein the light emitting layer over the second resin is spaced apart from the light emitting layer over the pixel electrode.

18. The display device according to claim 10, wherein the display device is incorporated in one selected from the group consisting of a telephone, a video camera, a digital camera, a goggle type display, an image reproduction apparatus, and a personal computer.

19. A display device comprising:
a transistor over a substrate;
an interlayer insulating film including resin over the transistor;
a pixel electrode over the interlayer insulating film, wherein the pixel electrode is electrically connected with the transistor;
a first resin covering an end portion of the pixel electrode;
a second resin over the first resin; and
a light emitting layer including an organic compound over the pixel electrode and the second resin.

20. The display device according to claim 19, wherein each of the first resin and the second resin is a bank.

21. The display device according to claim 19, wherein the first resin and the second resin is formed of a same material.

22. The display device according to claim 19, wherein the first resin and the second resin is formed of different materials.

23. The display device according to claim 19, wherein the second resin is wider than the first resin.

24. The display device according to claim 19, wherein the light emitting layer over the second resin is spaced apart from the light emitting layer over the pixel electrode.

25. The display device according to claim 19, wherein the display device is incorporated in one selected from the group consisting of a telephone, a video camera, a digital camera, a goggle type display, an image reproduction apparatus, and a personal computer.

26. A display device comprising:
a silicon oxide film over and in contact with a substrate;
a transistor over the silicon oxide film;
an interlayer insulating film including resin over the transistor;
a pixel electrode over the interlayer insulating film, wherein the pixel electrode is electrically connected with the transistor;
a first resin covering an end portion of the pixel electrode;
a second resin over the first resin; and
a light emitting layer including an organic compound over the pixel electrode and the second resin.

27. The display device according to claim 26, wherein each of the first resin and the second resin is a bank.

28. The display device according to claim 26, wherein the first resin and the second resin is formed of a same material.

29. The display device according to claim 26, wherein the first resin and the second resin is formed of different materials.

30. The display device according to claim 26, wherein the second resin is wider than the first resin.

31. The display device according to claim 26, wherein the light emitting layer over the second resin is spaced apart from the light emitting layer over the pixel electrode.

32. The display device according to claim 26, wherein the display device is incorporated in one selected from the group consisting of a telephone, a video camera, a digital camera, a goggle type display, an image reproduction apparatus, and a personal computer.

33. A display device comprising:
a first transistor and a second transistor, each including a poly-crystalline silicon region over a substrate, a gate insulating film over the poly-crystalline silicon region, and a gate electrode over the gate insulating film;
a first interlayer insulating film over the first transistor and the second transistor;

a second interlayer insulating film over the first interlayer insulating film;

a pixel electrode over the second interlayer insulating film, wherein the pixel electrode is electrically connected with the poly-crystalline silicon region of the second transistor;

a first resin partly in contact with a top surface of the pixel electrode;

a second resin over the first resin; and a light emitting layer including an organic compound over the pixel electrode and the second resin, wherein the light emitting layer has a region overlapping the poly-crystalline silicon region of the first transistor and the poly-crystalline silicon region of the second transistor.

34. The display device according to claim 33, wherein the first transistor is a switching transistor and the second transistor is a current-controlling transistor.

35. The display device according to claim 34, further comprising a third transistor whose source or drain is electrically connected to a source or drain of the switching transistor.

36. The display device according to claim 33, wherein each of the first resin and the second resin is a bank.

37. The display device according to claim 33, wherein the first resin and the second resin is formed of a same material.

38. The display device according to claim 33, wherein the first resin and the second resin is formed of different materials.

39. The display device according to claim 33, wherein the second resin is wider than the first resin.

40. The display device according to claim 33, wherein the light emitting layer over the second resin is spaced apart from the light emitting layer over the pixel electrode.

41. The display device according to claim 33, wherein the display device is incorporated in one selected from the group consisting of a telephone, a video camera, a digital camera, a goggle type display, an image reproduction apparatus, and a personal computer.

42. A display device comprising:

a silicon oxide film over and in contact with a substrate;

a first transistor and a second transistor, each including a poly-crystalline silicon region over and in contact with the silicon oxide film, a gate insulating film over the poly-crystalline silicon region, and a gate electrode over the gate insulating film;

a first interlayer insulating film over the first transistor and the second transistor;

a second interlayer insulating film over the first interlayer insulating film;

a pixel electrode over the second interlayer insulating film, wherein the pixel electrode is electrically connected with the poly-crystalline silicon region of the second transistor;

a first resin partly in contact with a top surface of the pixel electrode;

a second resin over the first resin; and a light emitting layer including an organic compound over the pixel electrode and the second resin, wherein the light emitting layer has a region overlapping the poly-crystalline silicon region of the first transistor and the poly-crystalline silicon region of the second transistor.

43. The display device according to claim 42, wherein the first transistor is a switching transistor and the second transistor is a current-controlling transistor.

44. The display device according to claim 43, further comprising a third transistor whose source or drain is electrically connected to a source or drain of the switching transistor.

45. The display device according to claim 42, wherein each of the first resin and the second resin is a bank.

46. The display device according to claim 42, wherein the first resin and the second resin is formed of a same material.

47. The display device according to claim 42, wherein the first resin and the second resin is formed of different materials.

48. The display device according to claim 42, wherein the second resin is wider than the first resin.

49. The display device according to claim 42, wherein the light emitting layer over the second resin is spaced apart from the light emitting layer over the pixel electrode.

50. The display device according to claim 42, wherein the display device is incorporated in one selected from the group consisting of a telephone, a video camera, a digital camera, a goggle type display, an image reproduction apparatus, and a personal computer.

* * * * *